US012601055B2

(12) United States Patent
Ahn et al.

(10) Patent No.: US 12,601,055 B2
(45) Date of Patent: Apr. 14, 2026

(54) METHOD OF DEPOSITING ATOMIC LAYER

(71) Applicant: Samsung Electronics Co., Ltd., Suwon-si (KR)

(72) Inventors: Hyunjun Ahn, Suwon-si (KR); Byounghoon Ji, Suwon-si (KR); Kyoungwoo Hong, Suwon-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 309 days.

(21) Appl. No.: 18/461,976

(22) Filed: Sep. 6, 2023

(65) Prior Publication Data

US 2024/0102160 A1　Mar. 28, 2024

(30) Foreign Application Priority Data

Sep. 27, 2022　(KR) ........................ 10-2022-0122874

(51) Int. Cl.
　H01L 21/02　　(2006.01)
　C23C 16/455　　(2006.01)
　H01J 37/32　　(2006.01)
　H10B 43/27　　(2023.01)

(52) U.S. Cl.
　CPC .. C23C 16/45527 (2013.01); H01J 37/32449 (2013.01); H01L 21/0228 (2013.01); *H01J 37/321* (2013.01); *H01J 2237/332* (2013.01); *H10B 43/27* (2023.02)

(58) Field of Classification Search
　None
　See application file for complete search history.

(56) References Cited

U.S. PATENT DOCUMENTS

| | | | |
|---|---|---|---|
| 7,713,884 B2 | 5/2010 | Ito et al. |
| 9,337,015 B2 | 5/2016 | Takeda et al. |
| 9,390,911 B2 | 7/2016 | Hirose et al. |
| 9,508,555 B2 | 11/2016 | Kaga et al. |
| 9,524,867 B2 | 12/2016 | Yamamoto et al. |
| 9,536,734 B2 | 1/2017 | Hanashima et al. |
| 9,773,661 B2 | 9/2017 | Nitta et al. |
| 9,890,458 B2 | 2/2018 | Yamamoto et al. |

(Continued)

FOREIGN PATENT DOCUMENTS

| | | |
|---|---|---|
| JP | 2006-245089 A | 9/2006 |
| JP | 2012-142482 A | 7/2012 |

(Continued)

*Primary Examiner* — Asok K Sarkar

(74) *Attorney, Agent, or Firm* — Harness, Dickey & Pierce, P.L.C.

(57) ABSTRACT

A method of depositing an atomic layer is provided. The method includes a plurality of deposition cycles. Each of the plurality of deposition cycles includes rotating a valve plate included in an exhaust port by a first angle while supplying a precursor to a chamber into which a substrate is loaded, rotating the valve plate by a second angle while supplying a purge gas to the chamber, rotating the valve plate by a third angle while supplying a reactor to the chamber, and rotating the valve plate by the second angle while supplying the purge gas to the chamber, and wherein the first angle, the second angle, and the third angle are certain angles between an upper surface of the valve plate and a virtual plane vertical to an internal path of the exhaust port, and the first angle differs from the third angle.

20 Claims, 18 Drawing Sheets

(56)         References Cited

U.S. PATENT DOCUMENTS

| | | | |
|---|---|---|---|
| 10,626,502 B2 | 4/2020 | Hashimoto et al. | |
| 2012/0111427 A1* | 5/2012 | Nozawa | C23C 16/511 |
| | | | 137/511 |
| 2014/0120723 A1 | 5/2014 | Fu et al. | |
| 2022/0170154 A1 | 6/2022 | Hanashima et al. | |
| 2024/0120209 A1* | 4/2024 | Dole | H01L 21/67253 |
| 2025/0087456 A1* | 3/2025 | Jayanti | H01J 37/32091 |
| 2025/0197993 A1* | 6/2025 | Song | H01L 21/67017 |

FOREIGN PATENT DOCUMENTS

| | | |
|---|---|---|
| JP | 2020-178020 A | 10/2020 |
| JP | 2021-158133 A | 10/2021 |
| KR | 10-0631305 B1 | 10/2006 |
| KR | 10-2071442 B1 | 1/2020 |

* cited by examiner

METHOD OF DEPOSITING ATOMIC LAYER

CROSS-REFERENCE TO RELATED APPLICATION

This application is based on and claims priority under 35 U.S.C. § 119 to Korean Patent Application No. 10-2022-0122874, filed on Sep. 27, 2022, in the Korean Intellectual Property Office, the disclosure of which is incorporated by reference herein in its entirety.

BACKGROUND

The inventive concepts relate to a method of depositing an atomic layer, and more particularly, to a method of depositing an atomic layer so as to manufacture a semiconductor device.

As industry increasingly advances and the demand for high-performance devices increases, processes of manufacturing semiconductors are approaching certain physical limitations.

SUMMARY

The inventive concepts provide a method of depositing an atomic layer, which may improve process efficiency.

According to an example embodiment of the inventive concepts, there is provided a method of depositing an atomic layer, the method including a plurality of deposition cycles, wherein each of the plurality of deposition cycles includes rotating a valve plate included in an exhaust port by a first angle while supplying a precursor to a chamber into which a substrate is loaded, rotating the valve plate by a second angle while supplying a purge gas to the chamber, rotating the valve plate by a third angle while supplying a reactor to the chamber, and rotating the valve plate by the second angle while supplying the purge gas to the chamber, and wherein the first angle, the second angle, and the third angle are certain angles between an upper surface of the valve plate and a virtual plane vertical to an internal path of the exhaust port, and the first angle differs from the third angle.

According to another example embodiment of the inventive concepts, there is provided a method of depositing an atomic layer, the method including a plurality of deposition cycles, wherein each of the plurality of deposition cycles includes rotating a valve plate included in an exhaust port by a first angle while adsorbing a precursor onto a chamber into which a substrate is loaded, rotating the valve plate by a second angle while purging and removing a portion of the precursor which is not adsorbed onto the substrate, based on a purge gas, rotating the valve plate by a third angle while adsorbing a reactor onto a surface of the substrate in the chamber, and rotating the valve plate by a fourth angle while purging and removing a portion of the reactor which is not adsorbed onto the substrate, based on the purge gas, wherein the first angle, the second angle, the third angle, and the fourth angle are certain angles between an upper surface of the valve plate and a virtual plane vertical to an internal path of the exhaust port, and wherein the third angle differs from the first angle and the fourth angle differs from the second angle.

According to another example embodiment of the inventive concepts, there is provided a method of depositing an atomic layer, the method including a plurality of deposition cycles, wherein each of the plurality of deposition cycles includes rotating a valve plate included in an exhaust port by a first angle while supplying a precursor to a chamber, into which a substrate is loaded, in a pulse form for 0.01 sec to 5 sec, rotating the valve plate by a second angle while supplying a first purge gas including at least one of a hydrogen gas and a nitrogen gas to the chamber, rotating the valve plate by a third angle while supplying a precursor to the chamber in a pulse form for 0.01 sec to 5 sec, and rotating the valve plate by a fourth angle while supplying a second purge gas including at least one of the hydrogen gas and the nitrogen gas to the chamber. In the rotating of the valve plate by the first angle, pressure of the chamber is within a range of 0.1 Torr to 30 Torr. The precursor includes at least one of titanium chloride ($TiCl_4$), tetrakis(diethyl-amino)titanium ($Ti(NEt_2)_4$), tetrakis(ethylmethylamino)titanium ($Ti(NEtMe)_4$), tungsten hexafluoride ($WF_6$), tungsten hexachloride ($WCl_6$), molybdenum dichloride dihydrogen ($MoCl_2H_2$), molybdenum tetrachloride ($MoCl_5$), or molybdenum hexacarbonyl ($Mo(CO)_6$. The first angle, the second angle, the third angle, and the fourth angle are angles between an upper surface of the valve plate and a virtual plane vertical to an internal path of the exhaust port, a time for which the purge gas is supplied to the chamber is longer than at least one of a time for which the precursor is supplied to the chamber, and the first angle differs from the second angle and the third angle, and the second angle is greater than the first angle.

BRIEF DESCRIPTION OF THE DRAWINGS

Example embodiments will be more clearly understood from the following detailed description taken in conjunction with the accompanying drawings in which:

FIG. 5B-1 to FIG. 5B-4 is a schematic diagram for describing a method of depositing an atomic layer, according to another example embodiment;

DETAILED DESCRIPTION OF THE EMBODIMENTS

Hereinafter, example embodiments will be described in detail with reference to the accompanying drawings. However, the inventive concepts may not be configured like being limited to example embodiments described below and may be implemented in other various forms. The following example embodiments may be provided for sufficiently transferring the scope of the inventive concepts to those of ordinary skill in the art, instead of being provided so that the inventive concepts are soundly completed.

Figure 1:
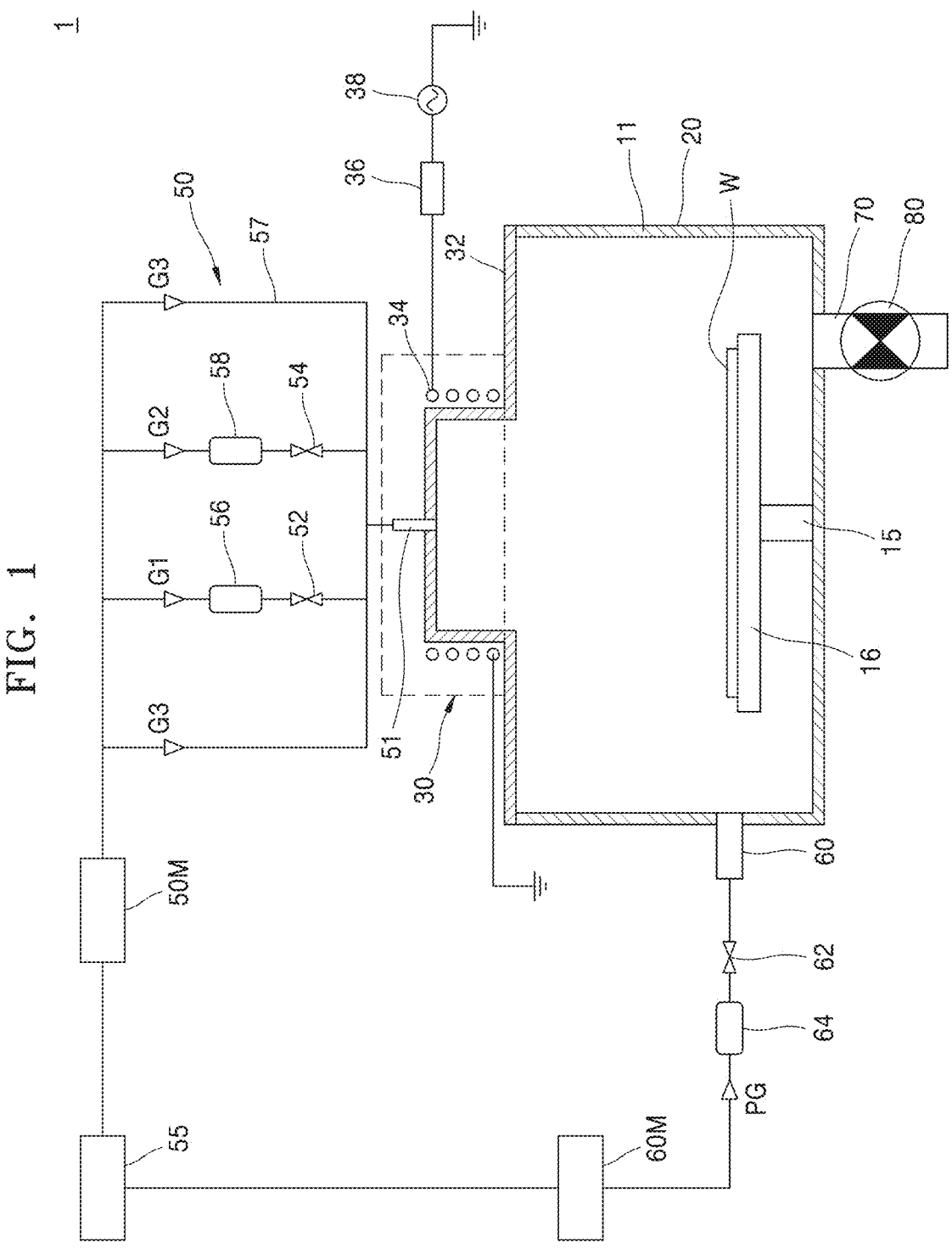
FIG. 1 is a configuration diagram for describing an atomic layer deposition apparatus according to an example embodiment.

FIG. 1 is a configuration diagram for describing an atomic layer deposition apparatus 1 according to an example embodiment.

Referring to FIG. 1, the atomic layer deposition apparatus 1 according to an example embodiment may include a first process chamber 20, a stage 16, and a plasma generator 30.

The first process chamber 20 may provide a space which accommodates a substrate W and where a thin film deposition process is performed. In detail, the first process chamber 20 may provide a space where an atomic layer deposition (ALD) process is performed.

ALD may be self-limiting surface processing. In more detail, the ALD process may include an operation of adsorbing a precursor onto the substrate W and an operation of providing a reactor to the substrate to cause the reactor to react with a precursor. In this case, the precursor adsorbed onto a surface of a substrate (or a surface of an uppermost material layer formed on a wafer) is limited to one atomic layer, and deposition of the precursor is self-limited. The reactor is limited by the precursor on a surface of the substrate W, and a reaction between the precursor and the reactor is self-limited.

The ALD process may be a cyclic process. The ALD process may include a plurality of steps which are periodically repeated. One atomic layer may be formed on the substrate W in one ALD cycle. A plurality of ALD cycles may be repeated, and thus, a film having a target thickness may be formed on the substrate W.

A gas supply unit 50 for supplying a precursor and a reactor each used in an ALD process to the substrate may be provided on the first process chamber 20. Also, the gas supply unit 50 may supply a purge gas for purging an unreacted precursor, an unreacted reactor, and reaction by-products to the substrate. The precursor and the reactor may be supplied into the first process chamber 20 through a gas supply port 51 disposed on the plasma generator 30. The purge gas may be supplied into the first process chamber 20 through a purge gas supply port 60 disposed on one surface of the first process chamber 20. The purge gas may be injected into the inside of the first process chamber 50 through the purge gas supply port 60 in a direction parallel with the surface of the substrate W.

Also, an exhaust unit 70 for exhausting an unreacted reactor, a purge gas, and reaction by-products may be provided at one end portion of the first process chamber 20. Although not shown in detail, the exhaust unit 70 may be connected to a vacuum pump so as to exhaust internal gases of the first process chamber 20. The exhaust unit 70 may include an exhaust valve 80 for adjusting the amount of gas exhausted from the first process chamber 20. The exhaust valve 80 is described below in detail.

According to an example embodiment, the stage 16 may support the substrate W. The stage 16 may include a ceramic material, such as nitride aluminum (AlN), or a metal material such as an aluminum (Al) or nickel (Ni)-based alloy. The stage 16 may include a heater for adjusting a temperature of the substrate W. The heater may be embedded in a support plate of the stage 16. The stage 16 may move the substrate W upward and downward or may rotate the substrate W. In detail, the substrate W may be rotated by a rotation driver 15 which supports the stage 16.

A plurality of (for example, three) support pins may be buried in the stage 16. The support pins may protrude from an upper surface of the stage 16 (i.e., a surface supporting a wafer S) and may detach the substrate W from the stage 16. Based on operations of the support pins, it may be easy to pick up and put down the substrate W.

The plasma generator 30 may be provided outside the first process chamber 20, and in detail, may be disposed on the first process chamber 20. The plasma generator 30 may be provided apart from the stage 16 by a certain distance so that plasma generated thereby does not directly contact the substrate W. The plasma generator 30 may include a second process chamber 32, which provides a space where plasma is generated as a source gas is injected therein, and a plasma antenna 34, which is wound as a coil type on an outer perimeter surface of the second process chamber 32 and induces a magnetic field to be generated in the second process chamber 32. The plasma generator 30 may generate plasma based on an inductively coupled plasma (ICP) scheme.

The second process chamber 32 may have a cylinder shape and may include an insulation member. For example, the insulation member may include quartz. A radio frequency (RF) power source 38 for supplying RF power may be connected to the plasma antenna 34. An impedance matching unit 36 may be further disposed between the plasma antenna 34 and the RF power source 38, for impedance matching. The gas supply unit 50 into which a source gas is injected may be provided on the plasma generator 30. The gas supply unit 50 may be connected to a plurality of gas supply lines 57 and may supply different gases as independent pulses to the plasma generator 30. The injection of the source gas through the gas supply unit 50 may be adjusted by a gas adjustor 50M.

The first process chamber 20 and the plasma generator 30 may be implemented in a structure which communicates with each other, and a plurality of source gases may be supplied into the first process chamber 20 through the plasma generator 30. At least some source gases may be changed to a plasma state in the plasma generator 30, and a radical component of plasma may be supplied to the first process chamber 20.

According to an example embodiment, the gas supply unit 50 may be configured to supply first to third gases G1 to G3.

The gas supply unit 50 may include a first buffer chamber 56, a second buffer chamber 58, a first valve 52, a second valve 54, and the gas supply line 57. The gas supply unit 50 may further include one or more mass flow controllers. The gas supply unit 50 may further include gas sources for supplying the first to third gases G1 to G3.

The gas supply line 57 may provide a flow path for transferring the first to third gases G1 to G3 to a chamber. The first buffer chamber 56, the second buffer chamber 58, the first valve 52, and the second valve 54 may be installed on the gas supply line 57.

The first and second buffer chambers 56 and 58 may temporarily store the first and second gases G1 and G2 supplied to a chamber. Accordingly, pressure of each of (or alternatively, at least one of) the first and second gases G1 and G2 of the first and second buffer chambers 56 and 58 before being supplied to a chamber may be adjusted to a set value.

The first and second valves 52 and 54 may be disposed between the first and second buffer chambers 56 and 58 and the first process chamber 20. The first and second gases G1 and G2 respectively stored in the first and second buffer chambers 56 and 58 may be supplied to the first process chamber 20 through the first and second valves 52 and 54. The first and second valves 52 and 54 may allow or block the transfer of the first and second gases G1 and G2 to a chamber. Based on operations of the first and second valves 52 and 54, the first and second gases G1 and G2 may be transferred to the first process chamber 20 in a pulse form. Therefore, a precursor included in the first gas G1 and a reactor included in the second gas G2 may be supplied to the first process chamber 20 in a pulse form.

In a non-limiting example embodiment, each of (or alternatively, at least one of) the first and second valves 52 and 54 may be an electronic automatic valve and may be controlled by an external electrical signal. According to example embodiments, each of (or alternatively, at least one of) the first and second valves 52 and 54 may be a valve for switching the supply and shutoff of a gas when performing an ALD process and may be an ALD-based valve which may be opened or closed at a high speed. According to example embodiments, the ALD-based valve may be opened or closed at a time interval of about 0.5 sec or less, and for example, may be opened or closed at a time interval of about 0.01 sec or less.

According to an example embodiment, the third gas G3 may be continuously supplied through the gas supply line 57. In this case, the third gas G3 may include an inert gas. The first gas G1 may include a precursor. The precursor may include at least one of titanium chloride (TiCl$_4$), tetrakis (diethylamino)titanium (Ti(NEt$_2$)$_4$), tetrakis(ethylmethyl-amino)titanium (Ti(NEtMe)$_4$), tungsten hexafluoride (WF$_6$), tungsten hexachloride (WCl$_6$), molybdenum dichloride dihydrogen (MoCl$_2$H$_2$), molybdenum tetrachloride (MoCl$_5$), or molybdenum hexacarbonyl (Mo(CO)$_6$. The second gas G2 may include a precursor. The reactor may include at least one of ammonia (NH$_3$), silane (SiH$_4$), diborane (B$_2$H$_6$), and hydrogen (H$_2$). The third gas G3 may include an inert gas such as nitrogen (N$_2$).

According to an example embodiment, a purge gas PG may be supplied into the first process chamber 20 through the purge gas supply port 60 disposed on the one surface of the first process chamber 20. The third buffer chamber 64 may temporarily store the purge gas PG supplied to a chamber. Accordingly, pressure of the purge gas PG of the third buffer chamber 64 before being supplied to a chamber may be adjusted to a set value.

The third valve 62 may be disposed between the third buffer chamber 64 and a side portion of the first process chamber 20. The purge gas PG stored in the third buffer chamber 64 may be supplied to the first process chamber 20 through the third valve 62. The third valve 62 may allow or shut off the transfer of the purge gas PG to the first process chamber 20. Based on an operation of the third valve 62, the purge gas PG may be transferred to the first process chamber 20 in a pulse form.

In a non-limiting example embodiment, the third valve 62 may be an electronic automatic valve and may be controlled by an external electrical signal. According to some example embodiments, the third valve 62 may be a valve for switching the supply and shutoff of the purge gas PG when performing an ALD process and may be an ALD-based valve which may be opened or closed at a high speed. According to some example embodiments, the ALD-based valve may be opened or closed at a time interval of about 0.5 sec or less, and for example, may be opened or closed at a time interval of about 0.01 sec or less.

Figure 2:
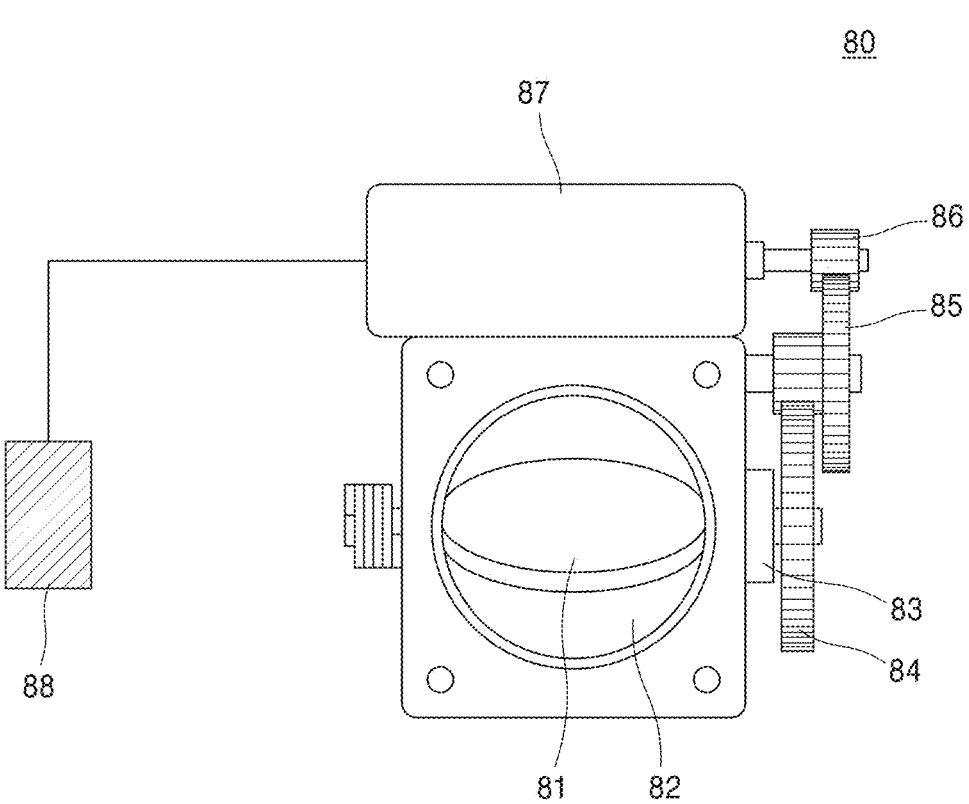
FIG. 2 is a plan view schematically illustrating an exhaust valve illustrated in FIG. 1.

FIG. 2 is a plan view schematically illustrating the exhaust valve 80 illustrated in FIG. 1, and FIGS. 3A to 3C are perspective views for describing a rotation process of a valve plate 81 illustrated in FIG. 2.

Referring to FIG. 2, an exhaust valve 80 may include a valve plate 81, an exhaust port 82, a position sensor 83, a plurality of gears (for example, first to third gears) 84 to 86, an actuator 87, and a controller 88. The valve plate 81 may be provided in the exhaust port 82 and may be configured to rotate in one direction. The position sensor 83 may be configured to measure a rotational angle of the valve plate 81 rotating in the exhaust port 82. The first gear 84 may be connected with the valve plate 81 and may rotate as one body with the valve plate 81. The second gear 85 may be connected with the first gear 84 and the second gear 86, and the third gear 86 may be connected with the second gear 85 and the actuator 87. Accordingly, each of (or alternatively, at least one of) the plurality of gears (the first to third gears 84 to 86) may be configured to transfer power, supplied from the actuator 87, to the valve plate 81.

The actuator 87 may include a motor, a hydraulic cylinder, and a pneumatic cylinder. For example, the actuator 87 may be a rotary motor. The controller 88 may be electrically connected with the actuator 87 and may control a rotational motion of the actuator 87. The controller 88 may be implemented with hardware, firmware, software, or an arbitrary combination thereof. For example, the controller 88 may be a computer device such as a workstation computer, a desktop computer, a laptop computer, or a tablet computer. For example, the controller 88 may include a memory device, such as read only memory (ROM) or random access memory (RAM), and a processor configured to execute an arithmetic operation and an algorithm, and for example, may include a microprocessor, a central processing unit (CPU), and a graphics processing unit (GPU).

Figure 3A:
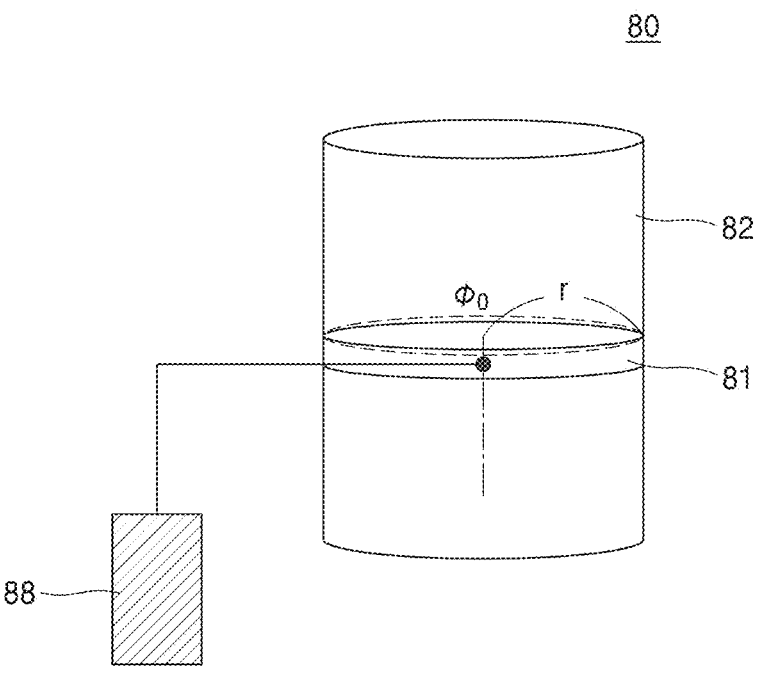
FIGS. 3A to 3C are perspective views for describing a rotation process of a valve plate illustrated in FIG. 2.
Figure 3B:
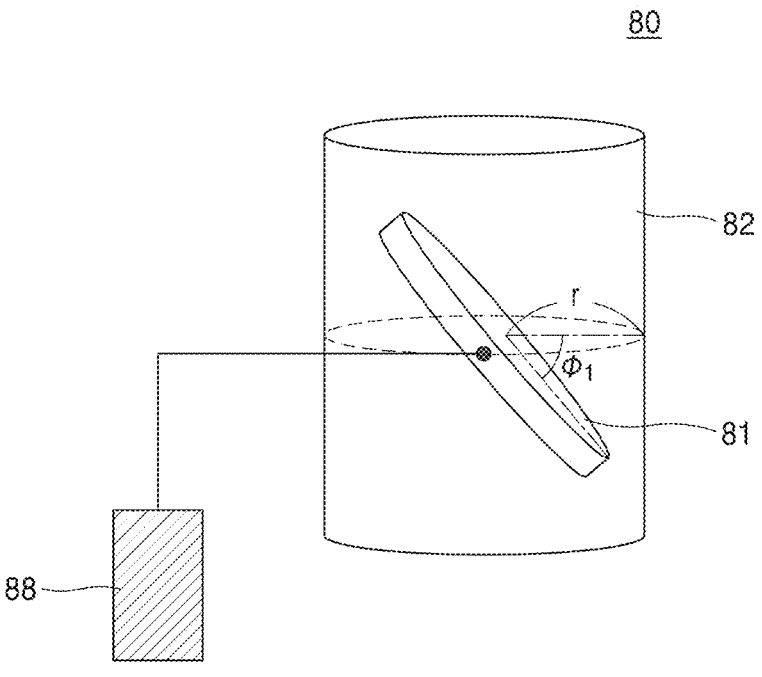
Figure 3C:
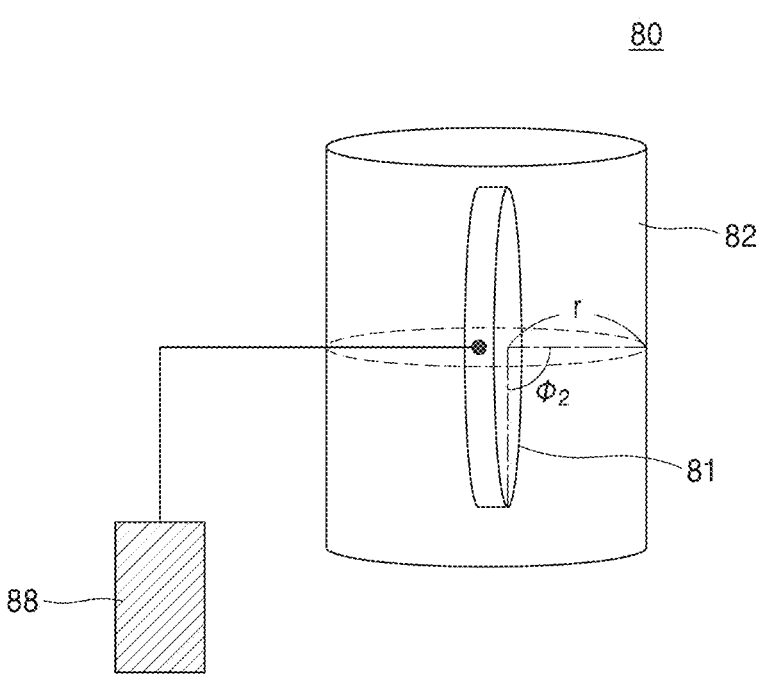

FIGS. 3A to 3C are perspective views for describing a rotation process of the valve plate 81 illustrated in FIG. 2.

Referring to FIG. 3A to 3C, a valve plate 81 may be provided in an exhaust port 82 and may open or close a space which enables fluid to flow in the exhaust port 82. The valve plate 81 may have a circular plate shape having a certain radius r. A space, where fluid flows, of the exhaust port 82 may have a cylindrical shape having substantially the same length as the radius r. However, the inventive concepts are not limited thereto. The controller 88 may be electrically connected with the valve plate 81 and may adjust an angle of the valve plate 81. A plurality of gears and a motor may be disposed between the controller 88 and the valve plate 81, but detailed configurations thereof are omitted.

An angle of the valve plate 81 may be defined as a certain angle between an upper surface of the valve plate 81 and a virtual plane vertical to an internal path of the exhaust port 82. A reference angle (DO illustrated in FIG. 3A may represent a case where the angle between the upper surface of the valve plate 81 and the virtual plane is 0 degrees. As illustrated in FIG. 3A, when the angle of the valve plate 81 is 0 degrees, the valve plate 81 may allow fluid not to flow in the exhaust port 82.

A reference angle θ1 illustrated in FIG. 3B may represent a case where the angle between the upper surface of the valve plate 81 and the virtual plane is greater than 0 degrees and less than 90 degrees. As illustrated in FIG. 3B, when the angle of the valve plate 81 is greater than 0 degrees and less than 90 degrees, the valve plate 81 may allow at least a portion of fluid to flow in the exhaust port 82.

A reference angle θ2 illustrated in FIG. 3C may represent a case where the angle between the upper surface of the valve plate 81 and the virtual plane is 90 degrees. As illustrated in FIG. 3C, when the angle of the valve plate 81 is 90 degrees, a flow rate of fluid flowing in the exhaust port 82 may be maximized. As described above, the controller 88 may adjust an angle by which the valve plate 81 rotates and may thus adjust a flow rate of fluid flowing through the exhaust port 82.

Figure 4A:
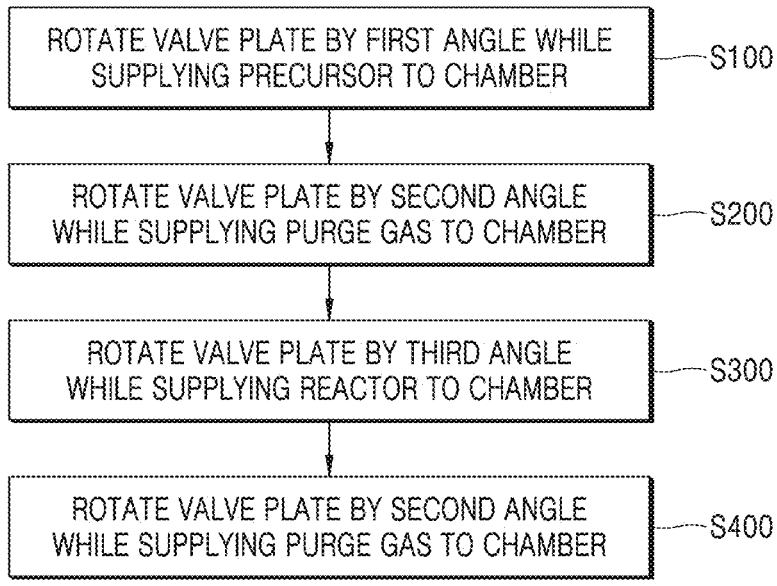
FIG. 4A is a flowchart for describing a method of depositing an atomic layer, according to an example embodiment.
Figure 4B:
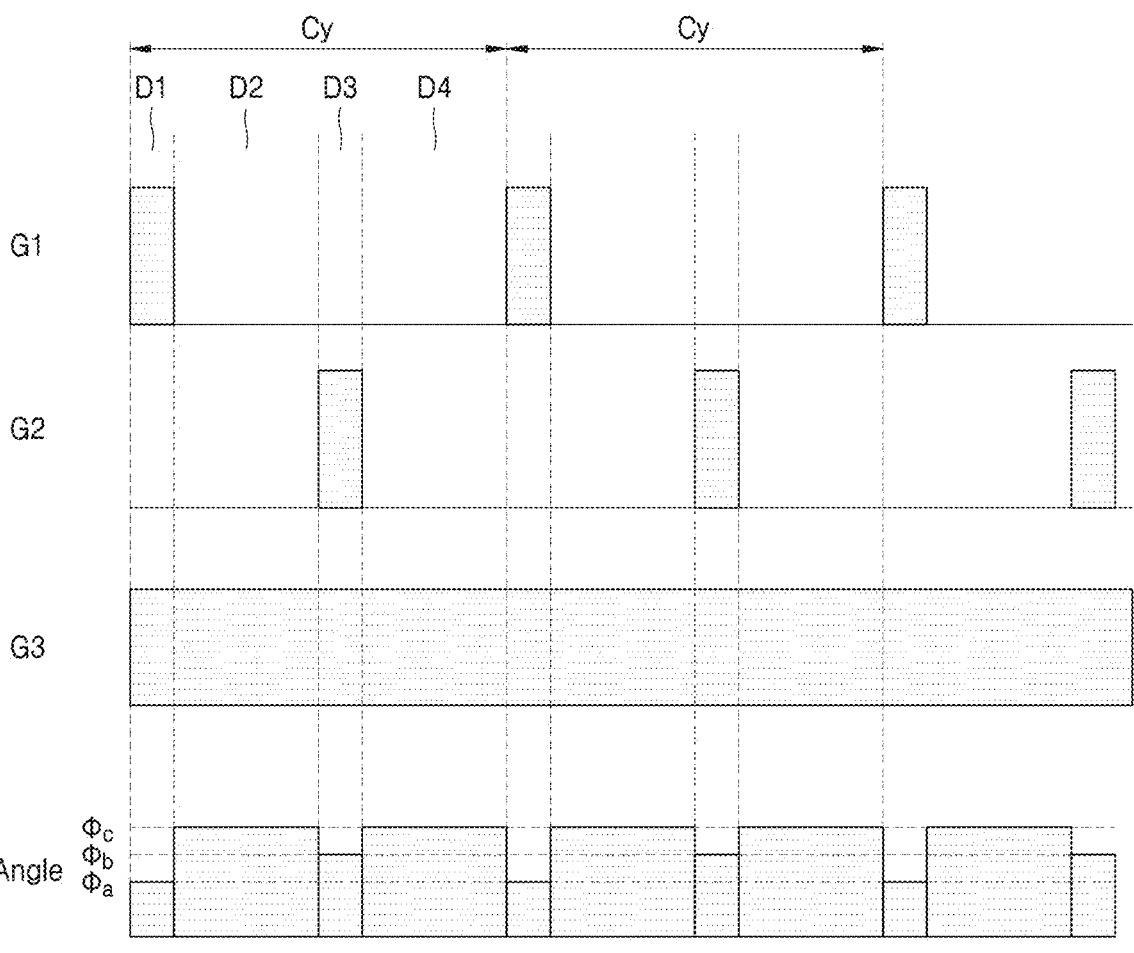
FIG. 4B is a graph for describing a method of depositing an atomic layer, according to an example embodiment.

FIG. 4A is a flowchart for describing a method of depositing an atomic layer, according to an example embodiment, and FIG. 4B is a graph for describing a method of depositing an atomic layer, according to an example embodiment. Hereinafter, FIGS. 4A and 4B are described with reference to FIG. 1.

Referring to FIGS. 1, 4A, and 4B, each ALD cycle Cy may include first to fourth duties D1 to D4. In an ALD method including a plurality of deposition cycles, in operation S100 which is one cycle, a valve plate may rotate by a first angle $\Phi a$ while supplying a first gas to the first process chamber 20. According to example embodiments, in operation S100, a precursor included in the first gas G1 may be supplied into the first process chamber 20. As described above with reference to FIGS. 3A to 3C, each of (or alternatively, at least one of) a plurality of angles $\Phi a$, $\Phi b$, and $\Phi c$ may be a certain angle between the upper surface of the valve plate 81 and a virtual plane vertical to the internal path of the exhaust port 82. The plurality of angles (for example, first to third angles) $\Phi a$, $\Phi b$, and $\Phi c$ may be different angles.

According to some example embodiments, S100 may correspond to the first duty D1 of the cycle Cy. That is, during the first duty D1, the first gas G1 may be supplied to the first process chamber 20. In this case, the first gas G1 may be supplied to the first process chamber 20 in a pulse form. The first gas G1 may be supplied to the first process chamber 20 during the first duty D1, and during the second to fourth duties D2 to D4, the first gas G1 may not be supplied to the first process chamber 20.

In operation S100, the valve plate 81 may rotate by the first angle $\Phi a$ while supplying the first gas G1 to the first process chamber 20. The first angle $\Phi a$ may be a smallest angle of the plurality of angles $\Phi a$, $\Phi b$, and $\Phi c$ by which the valve plate 81 rotates. As described above with reference to FIGS. 3A to 3C, as an angle by which the valve plate 81 rotates is reduced, the amount of gas discharged through the exhaust port 82 may decrease. Accordingly, during the first duty D1 of the plurality of duties D1 to D4, partial pressure of the first gas G1 may be highest in the first process chamber 20. A time for supplying the first gas G1 including a precursor may be within a range of about 0.01 sec to about 5 sec. As another example, the time for supplying the first gas G1 including a precursor may be within a range of about 1 sec to about 3 sec. Pressure of the first process chamber 20 during the first duty D1 may be within a range of about 0.1 Torr to about 30 Torr.

During the first to fourth duties D1 to D4, the third gas G3 may be supplied as a continuous gas.

According to some example embodiments, S200 may correspond to the second duty D2 of the cycle Cy. In the second duty D2, the first and second gases G1 and G2 may not be supplied. On the other hand, the third gas G3 which is a continuous gas may be supplied to the first process chamber 20. In this case, the purge gas PG may be supplied to the first process chamber 20 through a purge gas supply port 60. In this case, the purge gas PG may be supplied to the first process chamber 20 in a pulse form. The purge gas PG may include an inert gas such as a hydrogen ($H_2$) or nitrogen ($N_2$) gas.

In operation S200, the valve plate 81 may rotate by the second angle $\Phi b$ while supplying the purge gas PG to the first process chamber 20. The second angle $\Phi b$ may be a largest angle of the plurality of angles $\Phi a$, $\Phi b$, and $\Phi c$ by which the valve plate 81 rotates. As described above with reference to FIGS. 3A to 3C, as an angle by which the valve plate 81 rotates increases, the amount of gas discharged through the exhaust port 82 may increase. That is, comparing with the first duty D1, a higher amount of first gas G1 and third gas G3 may be discharged to the outside of a chamber. Also, the purge gas PG supplied in the second duty D2 may be discharged to the outside of the chamber. Accordingly, partial pressure of the first gas G1 may be lowest in the plurality of duties D1 to D4.

According to an example embodiment, a time for which the purge gas PG is supplied into the first process chamber 20 in the chamber may be longer than a time for which the first gas G1 including the precursor is supplied into the first process chamber 20.

According to some example embodiments, S300 may correspond to the third duty D3 of the cycle Cy. That is, during the third duty D3, the second gas G2 may be supplied into the first process chamber 20. In this case, the second gas G2 may be supplied to the first process chamber 20 in a pulse form. The second gas G2 may be supplied to the first process chamber 20 during the third duty D3, and during the first duty D1, the second duty D2, and the fourth duty D4, the second gas G2 may not be supplied to the first process chamber 20.

In operation S300, the valve plate 81 may rotate by the third angle $\Phi c$ while supplying the third gas G3 to the first process chamber 20. The third angle $\Phi c$ may be greater than the first angle $\Phi a$ and less than the second angle $\Phi b$ among the plurality of angles $\Phi a$, $\Phi b$, and $\Phi c$. Subsequently, as seen with reference to the description of the fourth duty D4, the valve plate 81 may rotate by the second angle $\Phi b$, which is greater than the third angle $\Phi c$, in the fourth duty D4. That is, the amount of second gas G2 discharged in the third duty D3 may be less than the amount of second gas G2 discharged in the fourth duty D4. Accordingly, during the third duty D3 of the plurality of duties D1 to D4, partial pressure of the second gas G2 may be highest in the first process chamber 20. Also, the third angle $\Phi c$ may differ from the first angle $\Phi a$ in operation S100. The kind of gas injected in operation S300 may differ from the kind of gas injected in operation S100, and thus, an optimized (or alternatively, improved) angle may be set based on the amount of injected gas in each operation.

According to some example embodiments, S400 may correspond to the fourth duty D4 of the cycle Cy. In the fourth duty D4, the first and second gases G1 and G2 may not be supplied. On the other hand, the third gas G3 which is a continuous gas may be supplied to the first process chamber 20. In this case, the purge gas PG may be supplied to the first process chamber 20 through a purge gas supply port 60. In this case, the purge gas PG may be supplied to the first process chamber 20 in a pulse form. The purge gas PG may include an inert gas such as a hydrogen ($H_2$) or nitrogen ($N_2$) gas.

In operation S400, the valve plate 81 may rotate by the second angle $\Phi b$ while supplying the purge gas PG to the first process chamber 20. The second angle $\Phi b$ may be a largest angle of the plurality of angles $\Phi a$, $\Phi b$, and $\Phi c$ by which the valve plate 81 rotates. As described above with reference to FIGS. 3A to 3C, as an angle by which the valve plate 81 rotates increases, the amount of gas discharged through the exhaust port 82 may increase. That is, comparing with the third duty D3, a higher amount of second gas G2 and third gas G3 may be discharged to the outside of the chamber. Also, the purge gas PG supplied in the fourth duty D4 may be discharged to the outside of the chamber. Accordingly, partial pressure of each of (or alternatively, at least one of) a reactor and the purge gas PG may be lowest in the plurality of duties D1 to D4.

According to an example embodiment, a time for which the purge gas PG is supplied into the first process chamber 20 may be longer than a time for which the second gas G2 including the reactor is supplied into the first process chamber 20. Therefore, a time for which the purge gas PG is supplied into the first process chamber 20 may be longer than at least one of a time for which the first gas G1 including the precursor is supplied into the first process chamber 20 and a time for which the third gas G3 including the reactor is supplied into the first process chamber 20.

Hereinabove, it has been described that S100, S200, S300, and S400 are performed in order, but in the ALD method described above, it may be construed that S200, S300, S400, and S100 are performed in order, S300, S400, S100, and S200 are performed in order, or S400, S100, S200, and S300 are performed in order.

According to some example embodiments, a length (or a time) of the second duty D2 may be longer than that of the first duty D1. According to some example embodiments, a length of the fourth duty D4 may be longer than that of the third duty D3. That is, a time for which the purge gas PG is supplied into the first process chamber 20 may be longer than a time for which the precursor is supplied into the first process chamber 20 or a time for which the reactor is supplied into the first process chamber 20. However, the inventive concepts are not limited thereto, and a length of the first duty D1 may be longer than that of the second duty D2 and a length of the third duty D3 may be longer than that of the fourth duty D4.

Each of (or alternatively, at least one of) the first duty D1 and the third duty D3 may be a period where gases other than nitrogen are supplied. Each of (or alternatively, at least one of) the second duty D2 and the fourth duty D4 may be a period where gases other than nitrogen are exhausted by the supply of a continuous nitrogen gas. According to some example embodiments, at least one of the first duty D1 and the third duty D3 may be relatively longer than at least one of the second duty D2 and the fourth duty D4, and thus, a deposition thickness of a film and a density of deposited film per cycle may be improved.

Figure 5A:
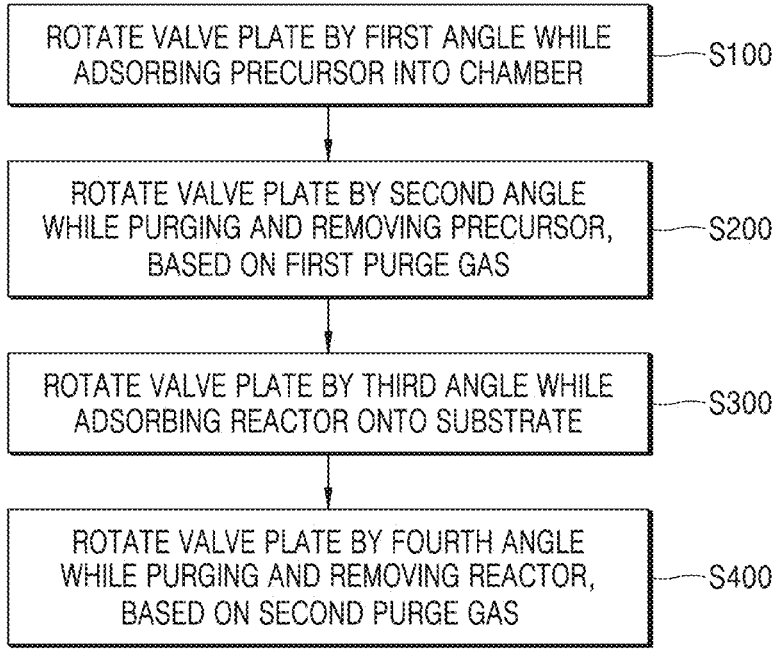
FIG. 5A is a flowchart for describing a method of depositing an atomic layer, according to another example embodiment.
Figures 1, 2, 3, 4, 5B:
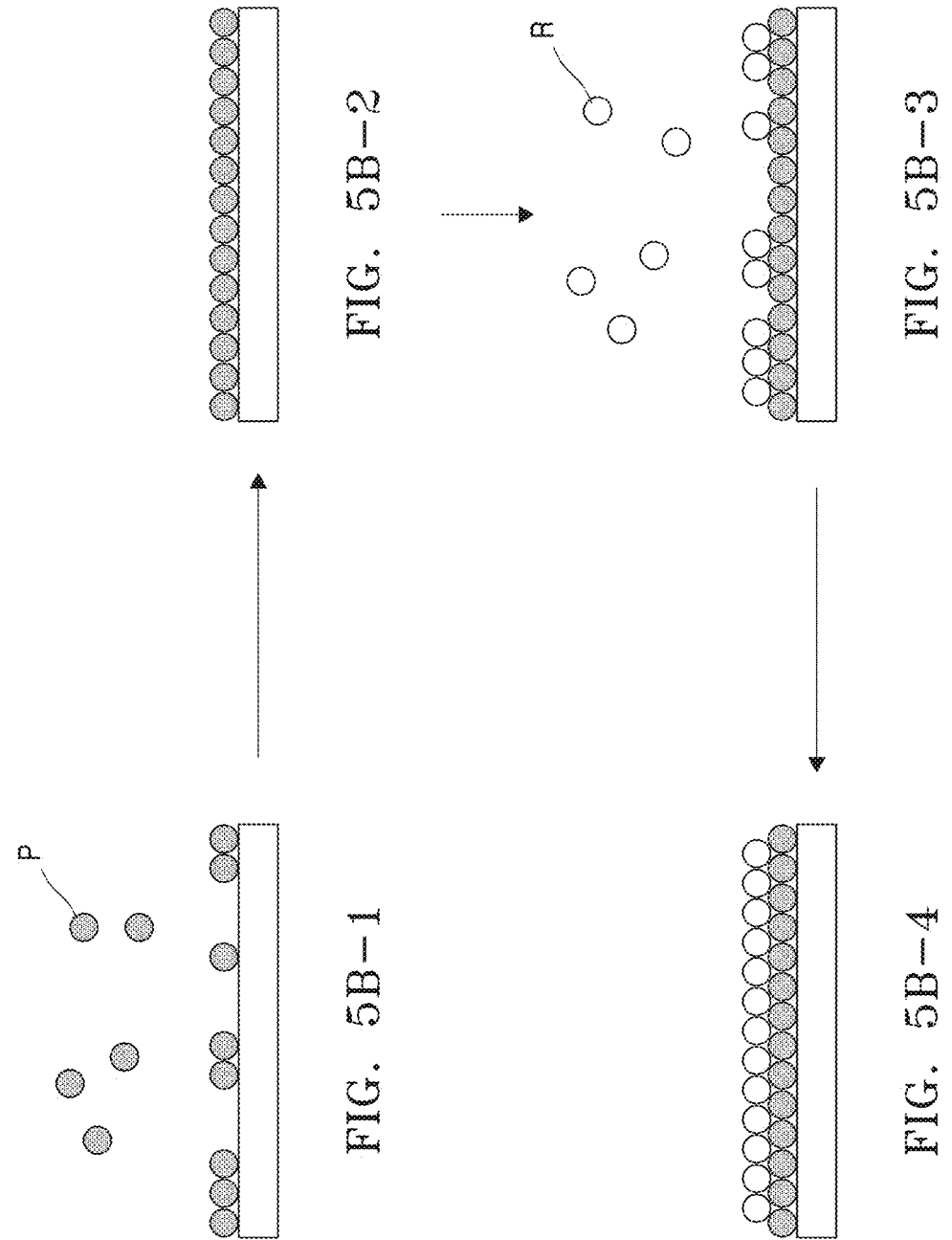
Figure 5C:
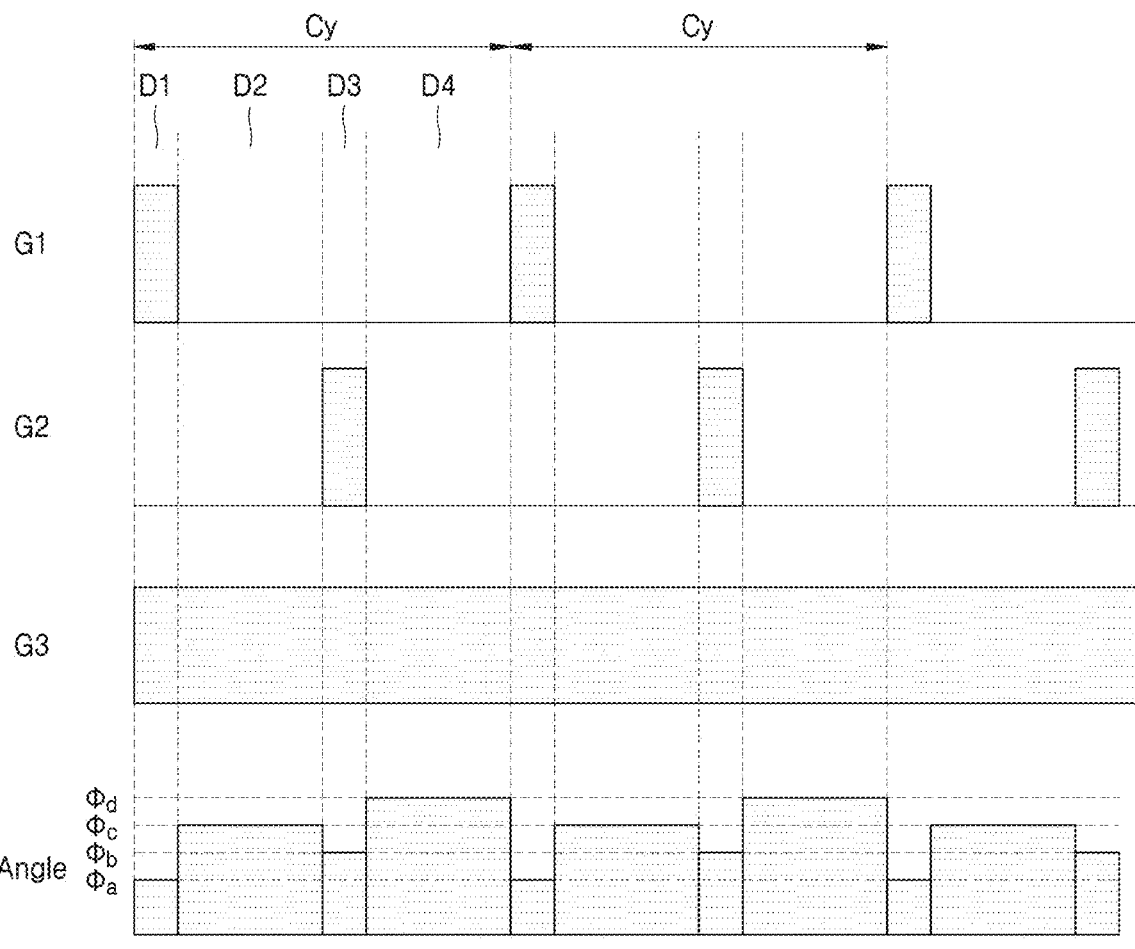
FIG. 5C is a graph for describing a method of depositing an atomic layer, according to another example embodiment.

FIG. 5A is a flowchart for describing a method of depositing an atomic layer, according to another example embodiment, FIG. 5B-1 to FIG. 5B-4 is a schematic diagram for describing a method of depositing an atomic layer, according to another example embodiment, and FIG. 5C is a graph for describing a method of depositing an atomic layer, according to another example embodiment.

Hereinafter, in describing S100, S200, S300, and S400 of FIG. 5, descriptions which are the same as or similar to the descriptions of FIG. 4A are omitted.

As described above with reference to FIGS. 3A to 3C, each of (or alternatively, at least one of) a plurality of angles Φa, Φb, Φc, and Φd may be a certain angle between an upper surface of the valve plate 81 and a virtual plane vertical to an internal path of the exhaust port 82. The plurality of angles (for example, first to fourth angles) Φa, Φb, Φc, and Φd may be different angles.

Referring to FIGS. 1, 2, and 5A to 5C, S100 of FIG. 5A may correspond to FIG. 5B-1 and a first duty D1 of FIG. 5C. At this time, a first gas G1 may be supplied to the first process chamber 20. The first gas G1 may include a precursor P. Accordingly, during the first duty D1, the precursor P may be adsorbed onto an upper surface of a substrate W. While the first duty D1 is continued, the amount of precursor P adsorbed onto the upper surface of the substrate W may increase, and thus, a precursor layer may be formed on the upper surface of the substrate W. Simultaneously or contemporaneously, the valve plate 81 provided in the exhaust port 82 may rotate by the first angle Φa. Here, the first angle Φa may be substantially the same as the first angle described above with reference to FIGS. 4A and 4B.

S200 of FIG. 5A may correspond to FIG. 5B-2 and a second duty D2 of FIG. 5C. At this time, a purge gas PG may be supplied to the first process chamber 20. The purge gas PG may include an inert gas. The purge gas PG may be supplied in a direction parallel with the surface of the substrate W mounted in the first process chamber 20. Accordingly, the precursor P floated on a precursor layer formed on the surface of the substrate W may be purged and removed. Simultaneously or contemporaneously, the valve plate 81 provided in the exhaust port 82 may rotate by the second angle Φb. However, unlike the second angle Φb described above with reference to FIGS. 4A and 4B, the second angle Φb may not be a largest angle of the plurality of angles Φa, Φb, Φc, and Φd. That is, the second angle Φb may be less than the fourth angle Φd in the fourth duty D4. Accordingly, a lower amount of gas than the amount of gas of a chamber discharged in the fourth duty D4 may be discharged.

S300 of FIG. 5A may correspond to FIG. 5B-3 and a third duty D3 of FIG. 5C. At this time, a second gas G2 may be supplied to the first process chamber 20. The second gas G2 may include a precursor P. Accordingly, during the third duty D3, the precursor P may be adsorbed onto the precursor formed on the upper surface of the substrate W. While the first duty D1 is continued, the amount of precursor P adsorbed onto the upper surface of the substrate W may increase, and thus, a precursor layer may be formed. Simultaneously or contemporaneously, the valve plate 81 provided in the exhaust port 82 may rotate by the first angle Φa. Here, the first angle Φa may be substantially the same as the first angle described above with reference to FIGS. 4A and 4B. Also, the third angle Φc may differ from the first angle Φa in operation S100. The kind of gas injected in operation S300 may differ from the kind of gas injected in operation S100, and thus, an optimized (or alternatively, improved) angle may be set based on the amount of injected gas in each operation. Accordingly, the third angle Φc may differ from the first angle Φa.

S400 of FIG. 5A may correspond to FIG. 5B-4 and a fourth duty D4 of FIG. 5C. At this time, a purge gas PG may be supplied to the first process chamber 20. The purge gas PG may include an inert gas, and according to some example embodiments, the purge gas PG may be substantially the same as the first purge gas G1. The purge gas PG may be supplied in a direction parallel with the surface of the substrate W mounted in the first process chamber 20. Accordingly, the precursor P floated on a precursor layer formed on the surface of the substrate W may be purged and removed. Simultaneously or contemporaneously, the valve plate 81 provided in the exhaust port 82 may rotate by the fourth angle Φd. The fourth angle Φd may be a largest angle of the plurality of angles Φa, Φb, Φc, and Φd by which the valve plate 81 rotates. Accordingly, the fourth angle Φd may differ from the second angle Φb. As described above with reference to FIGS. 3A to 3C, as an angle by which the valve plate 81 rotates increases, the amount of gas discharged through the exhaust port 82 may increase. That is, comparing with the third duty D3, a higher amount of second gas G2 and third gas G3 may be discharged to the outside of the chamber. Also, the purge gas PG supplied in the fourth duty D4 may be discharged to the outside of the chamber. Therefore, partial pressure of the second gas G2 may be lowest in the third duty D3 and the fourth duty D4 where the second gas G2 is supplied.

Figure 6:
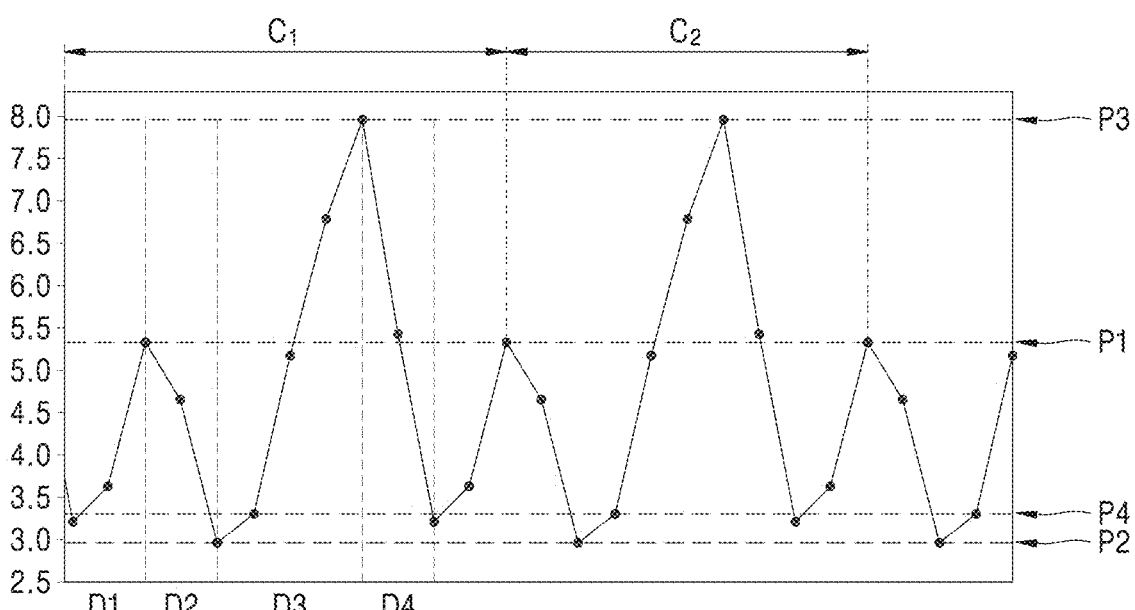
FIG. 6 is a graph for describing a variation process of pressure of a chamber according to another example embodiment.

FIG. 6 is a graph for describing a variation process of pressure of a chamber according to another example embodiment.

Referring to FIGS. 5A to 5C and 6, first pressure P1 may represent highest pressure of the first process chamber 20 in a first duty D1. A first gas G1 and a second gas G3 may be supplied into the first process chamber 20 during the first duty D1. Accordingly, internal pressure of the first process chamber 20 may continuously increase while the first duty D1 is continued. The first pressure P1 of the first process chamber 20 may be within a range of about 0.1 Torr to about 30 Torr.

Second pressure P2 may represent lowest pressure of the first process chamber 20 in a second duty D2. A third gas G3 and a purge gas PG may be supplied into the first process chamber 20 during the second duty D2. Also, a second angle Φb of the valve plate 81 in the second duty D2 may be higher than a first angle Φa in the first duty D1, and thus, the amount of discharged gas may be relatively higher. Accordingly, internal pressure of the first process chamber 20 may continuously decrease while the second duty D2 is continued. That is, the second pressure P2 may be lower than the pressure of the first process chamber 20 during the first duty D1.

Third pressure P3 may represent highest pressure of the first process chamber 20 in a third duty D3. The second gas G2 and the third gas G3 may be supplied into the first process chamber 20 during the third duty D3. Accordingly, the internal pressure of the first process chamber 20 may continuously increase while the third duty D3 is continued. The first pressure P1 of the first process chamber 20 may be within a range of about 0.1 Torr to about 30 Torr. As another example, the first pressure P1 of the first process chamber 20 may be within a range of about 1 Torr to about 20 Torr.

Fourth pressure P4 may represent lowest pressure of the first process chamber 20 in a fourth duty D4. A third gas G3 and a purge gas PG may be supplied into the first process chamber 20 during the fourth duty D4. Also, a fourth angle Φd of the valve plate 81 in the fourth duty D4 may be higher than a third angle Φc in the third duty D3, and thus, the amount of discharged gas may be relatively higher. Accordingly, the internal pressure of the first process chamber 20 may continuously decrease while the fourth duty D4 is continued. That is, the fourth pressure P4 may be lower than the pressure of the first process chamber 20 during the third duty D3.

Figure 7A:
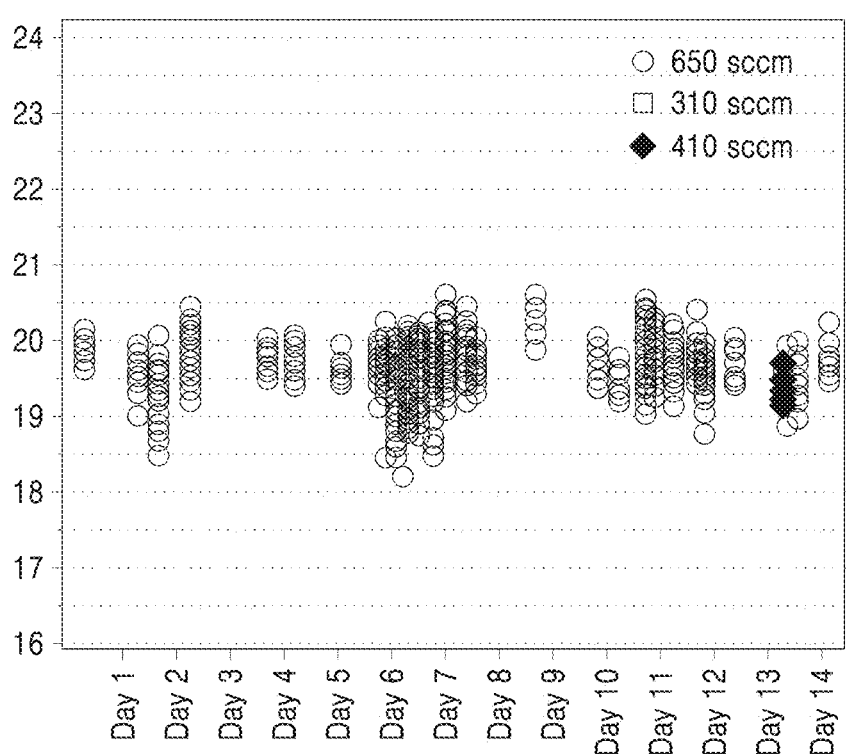
FIG. 7A and FIG. 7B are graphs for describing an effect of a method of depositing an atomic layer, according to an example embodiment.
Figure 7B:
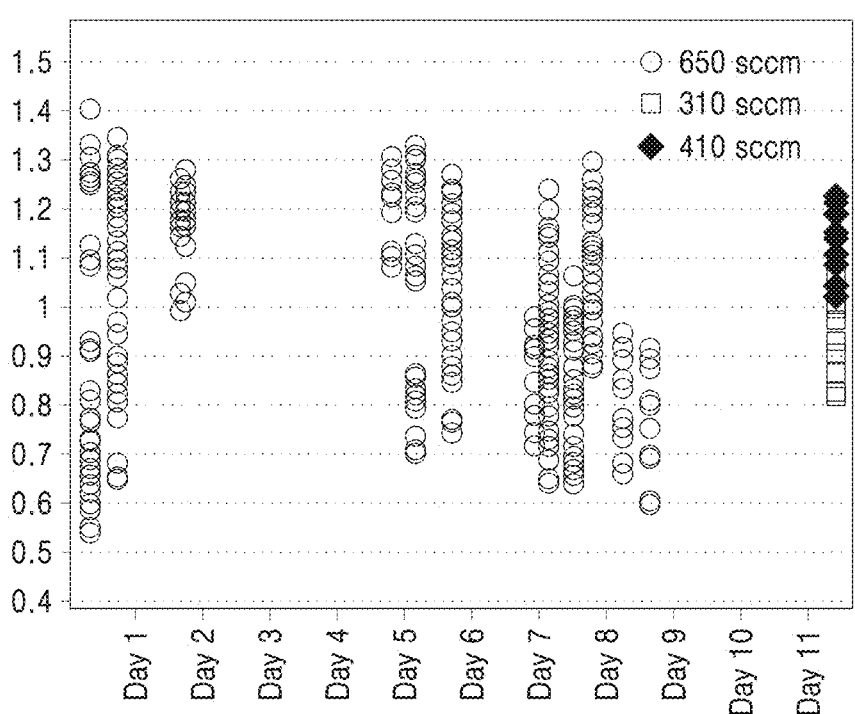

FIG. 7A and FIG. 7B are graphs for describing an effect of a method of depositing an atomic layer, according to an example embodiment.

Referring to FIGS. 4B, 5C, and 7A and 7B, FIG. 7A a graph may represent a thickness of a device layer deposited by an atomic layer deposition method with respect to the amount of supplied first gas G1 illustrated in FIGS. 4B and 5C. In this case, the device layer may be a blocking dielectric layer 166 (see FIG. 8B) illustrated in FIG. 8B or a gate dielectric layer 220 (see FIG. 9B) illustrated in FIG. 9B. Referring to FIG. 7A the graph, in FIG. 7A the graph, the abscissa axis may represent a day on which experiment data is collected, and the ordinate axis may represent a thickness of a device layer deposited by the ALD method according to an example embodiment. A unit may be Angstrom. A circular shape may represent a thickness of a device layer when the first gas G1 is supplied at about 650 sccm, a tetragonal shape may represent a thickness of a device layer when the first gas G1 is supplied at about 310 sccm, and a rhombus shape may represent a thickness of a device layer when the first gas G1 is supplied at about 410 sccm. Referring to FIG. 7A the graph, it may be seen that an appropriate thickness of a device layer may be formed despite that the amount of supplied first gas G1 is low, when the exhaust plate 81 rotates by a certain angle in each of (or alternatively, at least one of) a plurality of duties D1 to D4. Accordingly, as the exhaust plate 81 rotates by a certain angle in each duty, the amount of supplied first gas G1 may be reduced, and efficient ALD may be performed.

FIG. 7B a graph may represent a specific weight of unreacted molecules (molecules which do not participate in a chemical reaction) among molecules of a first gas G1 supplied into a first chamber. For example, when a TiN device layer is formed by using the first gas G1 including TiCl$_4$, unreacted molecules may be Cl$_2$. Referring to the graph FIG. 7B the graph, in FIG. 7B the graph, the abscissa axis may represent a day on which experiment data is collected, and the ordinate axis may represent a specific weight of unreacted molecules in the first chamber. A unit may be a percentage. A circular shape may represent a specific weight of unreacted molecules when the first gas G1 is supplied at about 650 sccm, a tetragonal shape may represent a specific weight of unreacted molecules when the first gas G1 is supplied at about 310 sccm, and a rhombus shape may represent a specific weight of unreacted molecules when the first gas G1 is supplied at about 410 sccm. Referring to FIG. 7B the graph, it may be seen that a specific weight of unreacted molecules may be maintained despite that the amount of supplied first gas G1 is low, when the exhaust plate 81 rotates by a certain angle in each of (or alternatively, at least one of) a plurality of duties D1 to D4. It may be seen that a specific weight of components configuring a semiconductor device layer is maintained as a specific weight of unreacted molecules is maintained. Accordingly, as the exhaust plate 81 rotates by a certain angle in each duty, the amount of supplied first gas G1 may be reduced, and efficient ALD may be performed.

Figure 8A:
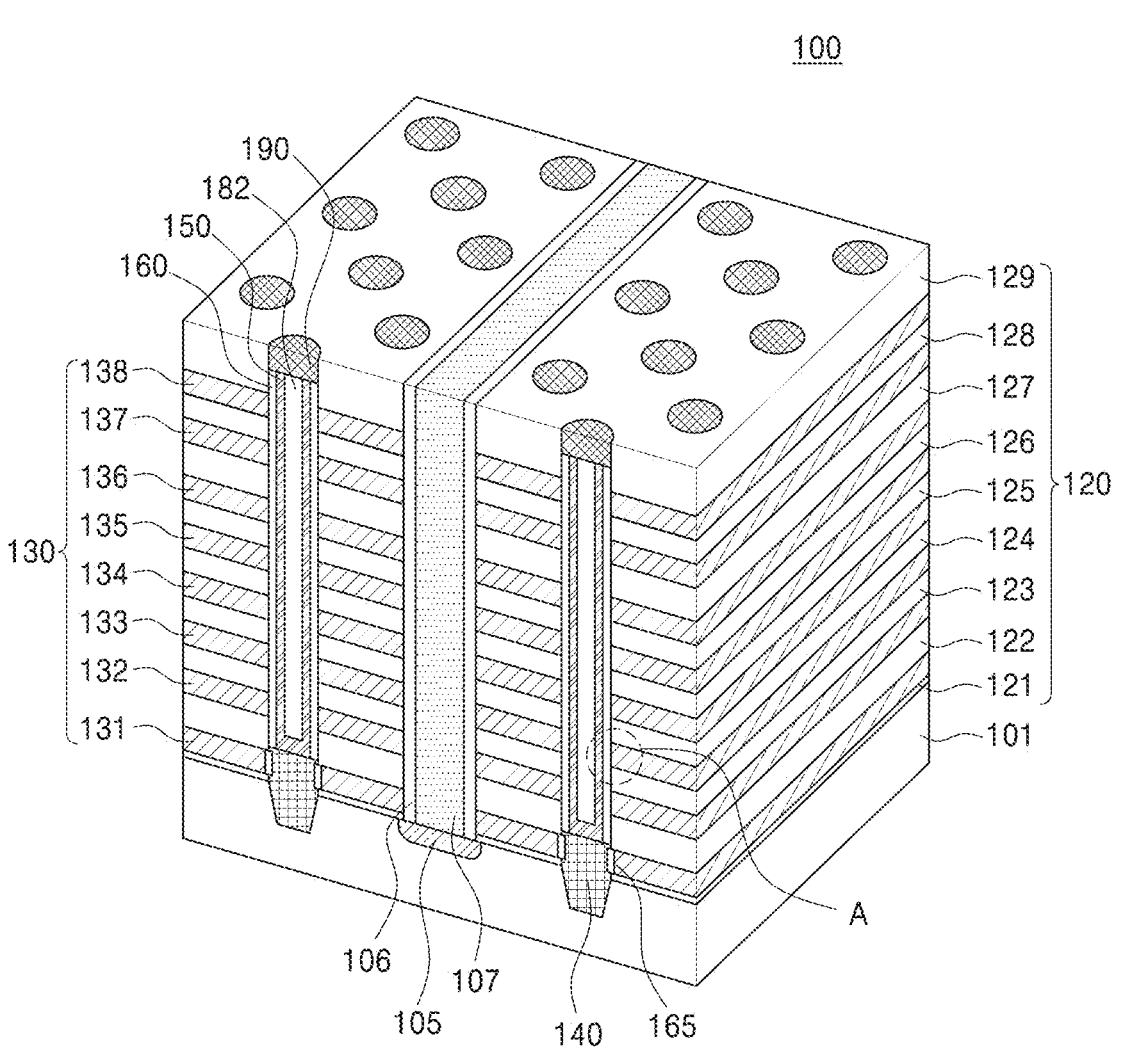
FIGS. 8A to 8C are perspective views and cross-sectional views illustrating a vertical-type semiconductor device manufactured by the method of depositing the atomic layer illustrated in FIGS. 4A and 5A.
Figure 8B:
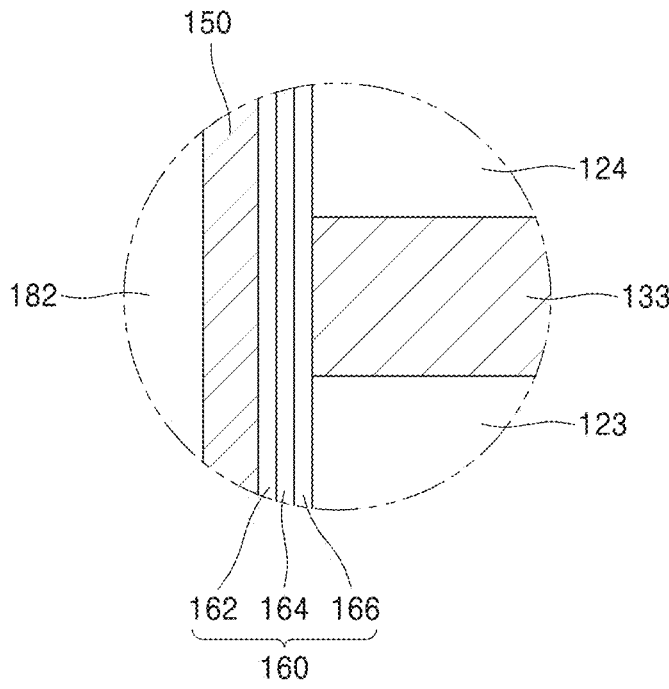
Figure 8C:
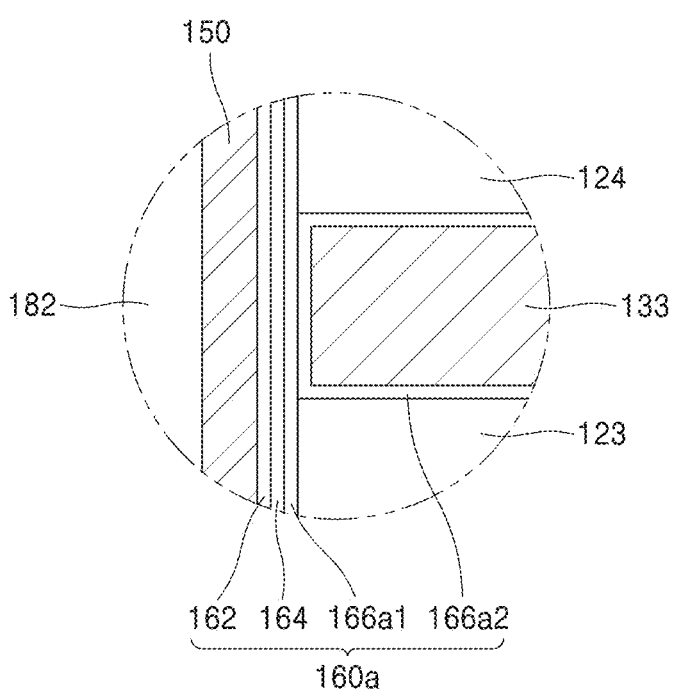

FIGS. 8A to 8C are perspective views and cross-sectional views illustrating a vertical-type semiconductor device 200 manufactured by the method of depositing an atomic layer illustrated in FIGS. 4A and 5A.

Referring to FIG. 8A, the vertical-type semiconductor device 200 may include a substrate 101, gate structures including interlayer insulation layers 120 and gate electrodes 130 alternately stacked on the substrate 101, and channels 150 passing through the interlayer insulation layers 120 and the gate electrodes 130 in a direction vertical to an upper surface of the substrate 101. Also, the vertical type memory device 200 may further include an epitaxial layer 140 disposed on the substrate 101 under the channels 150, a gate dielectric layer 160 disposed between the channels 150 and the gate electrodes 130, and a drain pad 190 on the channels 150 and a common source line 107 disposed in a source region 105.

The channels 150 having a pillar shape may be arranged to extend in a direction vertical to the upper surface of the substrate 101. The channels 150 may be formed in annular shape surrounding a first insulation layer 182 therein. Also, as illustrated, the arrangement of adjacent channels with a common source line 107 therebetween may be symmetrical.

The channels 150 may be electrically connected with the substrate 101 through the epitaxial layer 140, on a lower surface thereof. The channels 150 may include a semiconductor material such as crystal silicon, and the semiconductor material may be an undoped material or may be a material including p-type or n-type impurities.

The epitaxial layer 40 may be disposed on the substrate 101, under the channels 150. The epitaxial layer 140 may be disposed on a side surface of at least one gate electrode 130. Even when an aspect ratio of each of (or alternatively, at least one of) the channels 150 is increased by the epitaxial layer 140, the channels 150 may be stably and electrically connected with the substrate 101. The epitaxial layer 140 may include poly-crystal silicon, single-crystal silicon, poly-crystal germanium, or single-crystal germanium, which is doped with impurities or is not doped.

An epi insulation layer 165 may be disposed between the epitaxial layer 140 and an adjacent gate electrode 131. The epi insulation layer 165 may include oxide which is formed by thermally oxidizing a portion of the epitaxial layer 140. For example, the epi insulation layer 165 may include silicon oxide ($SiO_2$) which is formed by thermally oxidizing silicon (Si) and the epitaxial layer 140.

A plurality of gate electrodes 131 to 138 (130) may be arranged apart from the substrate 101 in a direction vertical to an upper surface of the substrate 101 along a side surface of each of (or alternatively, at least one of) the channels 150. The gate electrodes 130 may include poly-crystal silicon, a metal silicide material, or a metal material. The metal silicide material may be, for example, a silicide material of metal selected from among cobalt (Co), nickel (Ni), hafnium (Hf), platinum (Pt), tungsten (W), and titanium (Ti), or a combination thereof. Alternatively, a silicide material of metal may include one or more of Co, Ni, Hf, Pt, W, and Ti, or a combination thereof. The metal material may be, for example, W, aluminum (Al), or copper (Cu).

Each of (or alternatively, at least one of) a plurality of interlayer insulation layers 121 to 129 (120) may be arranged between two adjacent gate electrodes 130 of the plurality of gate electrodes 130. The interlayer insulation layers 120, like the gate electrodes 130, may be apart from one another in a direction vertical to the upper surface of the substrate 101. The interlayer insulation layers 120 may include an insulation material such as silicon oxide or silicon nitride.

The gate dielectric layer 160 may be disposed between the gate electrodes 130 and the channels 150. Although not shown in detail in FIG. 8A, the gate dielectric layer 160 may include a tunneling dielectric layer, a charge storage layer, and a blocking dielectric layer, which are stacked, for example sequentially stacked, from the channels 150. This is described below in more detail with reference to FIGS. 8A and 8C.

FIGS. 8B and 8C are diagrams illustrating the enlargement of a region A of FIG. 8A. Referring to FIG. 8B, a gate dielectric layer 160 may include a tunneling dielectric layer 162, a charge storage layer 164, and a blocking dielectric layer 166, which are stacked, for example sequentially stacked, from the channels 150. The gate dielectric layer 160 may be disposed so that all of the tunneling dielectric layer 162, the charge storage layer 164, and the blocking dielectric layer 166 extend in parallel along the channels 150. A relative thickness of each of the layers included in the gate dielectric layer 160 is not limited to the illustration of the drawing and may be variously changed.

The tunneling dielectric layer 162 may include silicon oxide. The charge storage layer 164 may include silicon nitride or silicon oxynitride. The blocking dielectric layer 166 may include silicon oxide, high-k dielectric metal oxide, or a combination thereof. The high-k dielectric metal oxide may be, for example, aluminum oxide ($Al_2O_3$), tantalum oxide ($Ta_2O_3$), titanium oxide ($TiO_2$), yttrium oxide ($Y_2O_3$), zirconium oxide ($ZrO_2$), zirconium silicon oxide ($ZrSi_xO_y$), hafnium silicon oxide ($HfSi_xO_y$), lanthanum oxide ($La_2O_3$), lanthanum aluminum oxide ($LaAl_xO_y$), lanthanum hafnium oxide ($LaHf_xO_y$), hafnium aluminum oxide ($HfAl_xO_y$), praseodymium oxide ($Pr_2O_3$), or a combination thereof.

Referring to FIG. 8C, a gate dielectric layer 160a may include a tunneling dielectric layer 162, a charge storage layer 164, and blocking dielectric layers 166a1 and 166a2, which are stacked, for example sequentially stacked, from the channels 150. The blocking dielectric layers 166a1 and 166a2 may include two layers, and for example, may include a first blocking dielectric layer 166a1 and a second blocking dielectric layer 166a2. The first blocking dielectric layer 166a1 may be disposed to extend in parallel with the channels 150, and the second blocking dielectric layer 166a2 may be disposed to surround the gate electrode layer 133. For example, the first blocking dielectric layer 166a1 may include silicon oxide, and the second blocking dielectric layer 166a2 may include high-k dielectric metal oxide.

A drain pad 190 may be disposed to cover an upper surface of the first insulation layer 182 and to be electrically connected with the channels 150, on a memory cell string. The drain pad 190 may include, for example, doped poly-crystal silicon. Although not shown, the drain pad 190 may be electrically connected with a bit line BL formed on the drain pad 190.

A source region 105 may be disposed in a partial region of the substrate 101, under the memory cell string. The source region 105 may extend in one direction to be adjacent to an upper surface of the substrate 101. The common source line 107 may include a conductive material. For example, the common source line 107 may include W, Al, or Cu. The common source line 107 may be electrically disconnected from the gate electrodes 130 by the second insulation layer 106.

According to an example embodiment, the blocking dielectric layer 166 may include high-k dielectric metal oxide, and the high-k dielectric metal oxide may be formed by the atomic layer deposition apparatus 1 and the ALD method using the same described above with reference to FIGS. 1 to 7. In detail, a precursor including a metal material may be provided in the first buffer chamber 56, and then, may be supplied as a pulse to the first process chamber 20 for a certain time. The precursor may be an organic compound including a metal element. For example, the precursor may include Al, Hf, Zr, La, or Ta. The precursor may be supplied to the substrate W via the second process chamber 32 provided on the first process chamber 20. At this time, a state where plasma is not formed in the second process chamber 32 may be maintained. In other words, RF power may not be supplied to the plasma antenna 34 while the precursor is being supplied into the first process chamber 20. The precursor may be adsorbed onto an upper surface of the epitaxial layer 140. Subsequently, a first purge operation may be performed by supplying a purge gas into the first process chamber 20.

Subsequently, a reactor including oxygen may be provided in the second buffer chamber 58, and then, may be supplied as a pulse to the first process chamber 20 for a certain time. The reactor may be selected from the group consisting of oxygen ($O_2$), ozone ($O_3$), water vapor ($H_2O$), and hydrogen peroxide ($H_2O_2$). Alternatively, the reactor may include oxygen ($O_2$), ozone ($O_3$), water vapor ($H_2O$), and hydrogen peroxide ($H_2O_2$). Only a radical component of an oxygen reactor having a plasma state may be supplied as a pulse into the first process chamber 20 for a certain time. An oxygen radical having high reactivity may react with the adsorbed precursor, and thus, metal oxide may be conformally formed on the upper surface of the epitaxial layer 140 to have an atomic layer thickness. Subsequently, a second purge operation may be performed by supplying a purge gas into the first process chamber 20. The oxygen reactor and reaction by-products, which do not react in the second purge operation, may be discharged through the exhaust unit 70. Hereinabove, only a method of forming the blocking dielectric layer 166 by using an ALD process has been described, but the inventive concepts are not limited thereto and the tunneling dielectric layer 162 and the charge storage layer 164 may be formed by a combination of various precursors and reactors.

Figure 9A:
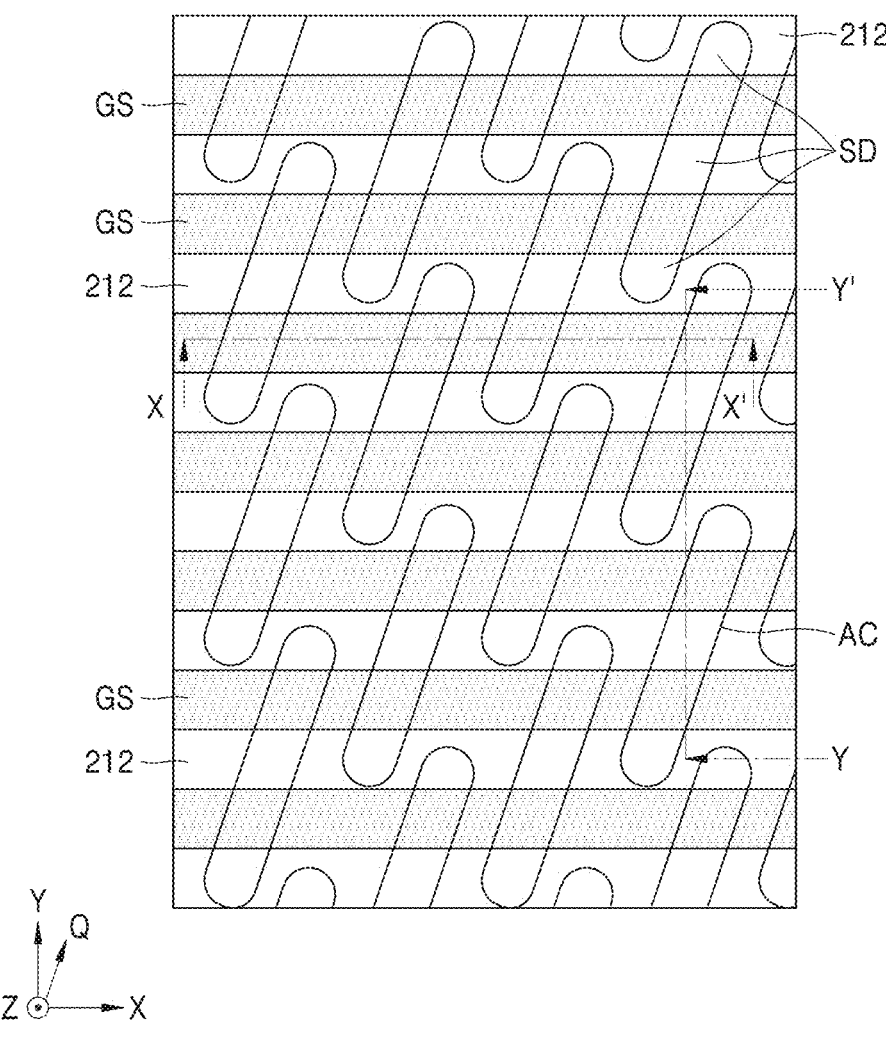
FIGS. 9A and 9B are cross-sectional views illustrating a semiconductor device manufactured by the method of depositing an atomic layer illustrated in FIGS. 4A and 5A.
Figure 9B:
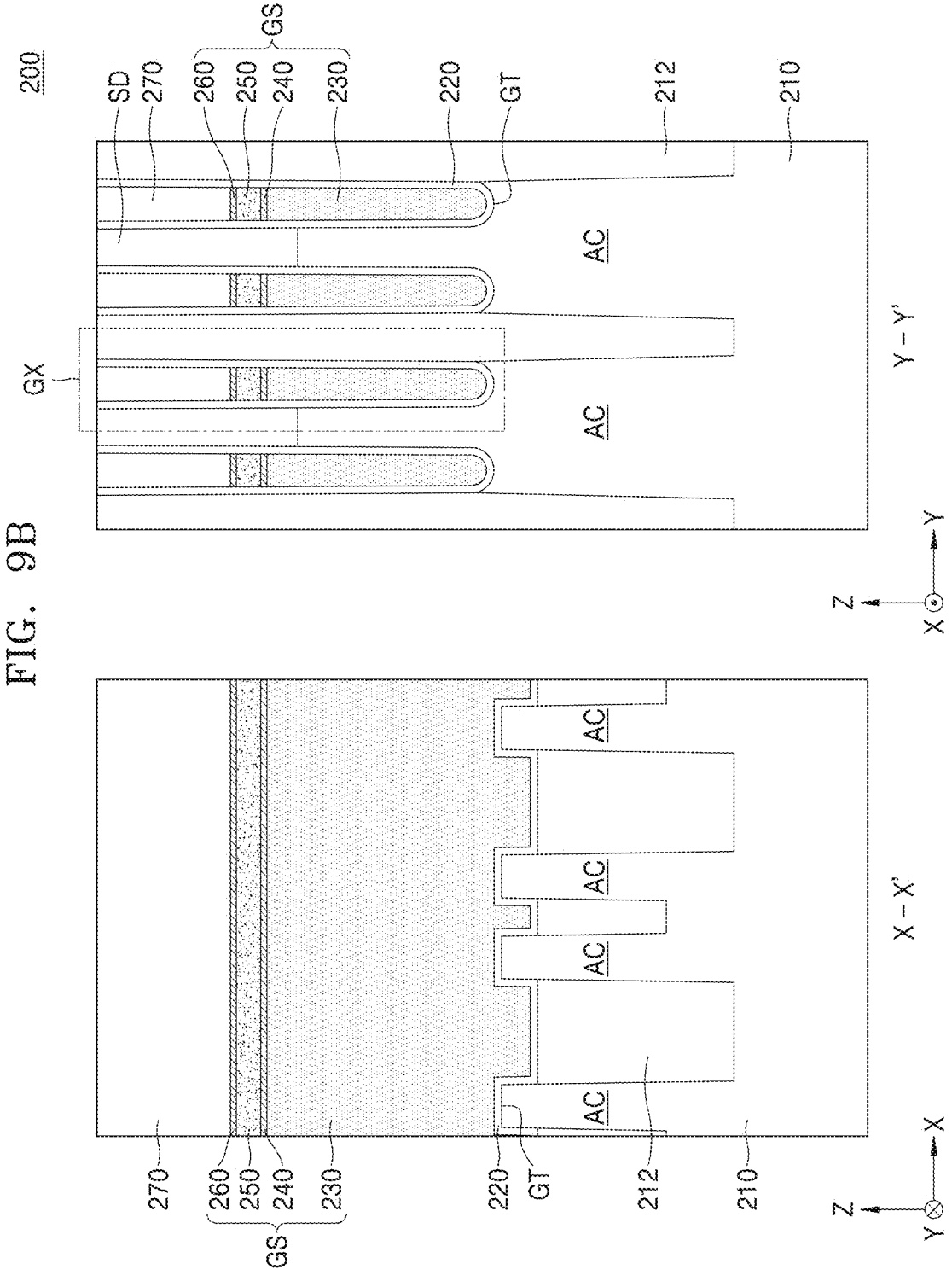

FIGS. 9A and 9B are cross-sectional views illustrating a semiconductor device manufactured by the method of depositing the atomic layer illustrated in FIGS. 4A and 5A.

FIG. 9A is a perspective view illustrating main elements of an integrated circuit device 200 according to some example embodiments, and FIG. 9B is a cross-sectional view illustrating main elements of cross-sectional surfaces taken along line X-X' and line Y-Y' of FIG. 9A.

Referring to FIGS. 9A and 9B, the integrated circuit device 200 may include a plurality of active regions AC limited by a device isolation layer 212 and a substrate 210 where a plurality of gate trenches GT extending across the plurality of active regions AC are formed.

The plurality of active regions AC may be repeatedly formed apart from one another in an X direction and a Y direction, and each of (or alternatively, at least one of) the plurality of active regions AC may extend in an inclination direction to have a long axis in one direction (a Q direction of FIG. 9A) which differs from the X direction and the Y direction. The plurality of gate trenches GT may have a plurality of line shapes which extend in parallel in the X direction.

The device isolation layer 212 may include silicon oxide, silicon nitride, or a combination thereof.

A gate dielectric layer 220, a gate structure GS which buries a portion of each of (or alternatively, at least one of) the gate trenches GT on the gate dielectric layer 220, and an insulation capping pattern 270 which covers the gate structure GS in the gate trench GT may be formed in the plurality of gate trenches GT.

A level of a portion, at which the substrate 210 is exposed, of a lower surface of the gate trench GT may be higher than a level of a portion, at which the device isolation layer 212 is exposed, of the lower surface of the gate trench GT. Accordingly, a lower surface of the gate structure GS may have a concave-convex shape, based on a lower surface profile of the lower surface of the gate trench GT. Accordingly, a transistor having a saddle fin structure (saddle FINFET) may be formed in the plurality of active regions AC.

The gate dielectric layer 220 may cover an inner surface of the gate trench GT to contact the active region AC and the device isolation layer 212. The gate dielectric layer 220 may include a silicon oxide film, a silicon nitride film, a silicon oxynitride film, an oxide/nitride/oxide (ONO) film, or a high-k dielectric film having a dielectric constant which is greater than that of the silicon oxide film. The high-k dielectric film may have a dielectric constant of about 10 to about 25, and for example, may include $HfO_2$, $Al_2O_3$, $HfAlO_3$, $Ta_2O_3$, or $TiO_2$.

The insulation capping layer 270 may include a silicon nitride film, a silicon oxynitride film, a silicon oxide film, or a combination thereof.

The gate structure GS may include gate sidewalls facing the active region AC, and the insulation capping pattern 270 may include insulation sidewall portions facing the active region AC. A source/drain region SD may be formed at both sides of the gate structure GS in the plurality of active regions AC.

The gate structure GS may include a lower gate line 230 having a first work function and an upper gate line 250 having a second work function which is higher than the first work function. The lower gate line 230 may include metal, metal nitride, metal carbide, or a combination thereof. In some example embodiments, the lower gate line 230 may include Ti, TiN, Ta, TaN, W, WN, TiSiN, WSiN, or a combination thereof. The upper gate line 250 may include doped polysilicon.

A first blocking layer 240 may be disposed between the lower gate line 230 and the upper gate line 250. The first blocking layer 240 may prevent or hinder materials of the lower gate line 230 and the upper gate line 250 from being mutually diffused or reacting with each other, between the lower gate line 230 and the upper gate line 250. In some example embodiments, the first blocking layer 240 may prevent or hinder metal included in the lower gate line 230 from reacting with silicon included in the upper gate line 250, and thus, may prevent or hinder a metal silicide film from being formed between the lower gate line 230 and the upper gate line 250.

A second blocking layer 260 may be disposed between the upper gate line 250 and the insulation capping pattern 270. The second blocking layer 260 may prevent or hinder materials of the upper gate line 250 and the insulation capping pattern 270 from being mutually diffused or reacting with each other, between the upper gate line 250 and the insulation capping pattern 270.

Each of (or alternatively, at least one of) the first blocking layer 240 and the second blocking layer 260 may include a sidewall facing the source/drain region SD with the gate dielectric layer 220 therebetween.

The first blocking layer 240 and the second blocking layer 260 may include different materials. Each of (or alternatively, at least one of) the first blocking layer 240 and the second blocking layer 260 may include a conductive material, a dielectric material, or a combination thereof. In some example embodiments, the first blocking layer 240 may include metal, and the second blocking layer 260 may not include metal. In some other example embodiments, at least one of the first blocking layer 240 and the second blocking layer 260 may include an oxide film, a nitride film, or a combination thereof, which includes metal. In some other example embodiments, at least one of the first blocking layer 240 and the second blocking layer 260 may include an oxide film, a nitride film, or a combination thereof, which does not include metal. In some other example embodiments, the first blocking layer 240 may include a multilayer including metal, and the second blocking layer 260 may include a single layer including no metal. Each of (or alternatively, at least one of) the first blocking layer 240 and the second blocking layer 260 may have a thickness of about 1 Å to about 20 Å.

In the gate structure GS of the integrated circuit device 200, the first blocking layer 240 may be disposed between the lower gate line 230 and the upper gate line 250 having different work functions, and thus, may prevent or hinder undesired metal silicide being formed because materials of the lower gate line 230 and the upper gate line 250 are mutually diffused or react with each other, work function being changed, and a change in volume occurring, and may contribute to maintain the original properties and electrical characteristics of the lower gate line 230 and the upper gate line 250.

Moreover, in the gate structure GS of the integrated circuit device 200, the second blocking layer 240 may be disposed between the upper gate line 250 and the insulation capping pattern 270, and thus, even when a thickness of the upper gate line 250 is excessively thinned or a relative large thickness deviation occurs in the upper gate line 250 as a result of an etch-back process which is performed when performing a process of forming the upper gate line 250, an undesired reaction may be prevented or hindered between the lower gate line 230 and the upper gate line 250 or a work function of the upper gate line 250 being changed because the insulation capping pattern 270 on the upper gate line 250 being diffused to a lower portion and the upper gate line 250 may be protected by the second blocking layer 260 when performing a process of forming the insulation capping pattern 270, thereby preventing or hindering the upper gate line 250 or the lower gate line 230 thereunder from being physically or chemically damaged.

In an example embodiment, the lower gate line 230 may include Ti, TiN, Ta, TaN, W, WN, TiSiN, WSiN, or a combination thereof. In this case, the lower gate line 230 may be formed by using an ALD process using a precursor including Ti or W.

In detail, a precursor including Ti may be provided in the first buffer chamber 56, and then, may be supplied as a pulse to the first process chamber 20 for a certain time. The precursor may be an organic compound including a metal element. For example, the precursor may include TiCl₄. The precursor may be supplied to the substrate W via the second process chamber 32 provided on the first process chamber 20. At this time, a state where plasma is not formed in the second process chamber 32 may be maintained. In other words, RF power may not be supplied to the plasma antenna 34 while the precursor is being supplied into the first process chamber 20. The precursor may be adsorbed onto an upper surface of the epitaxial layer 140. Subsequently, a first purge operation may be performed by supplying a purge gas into the first process chamber 20.

Subsequently, a reactor including nitrogen may be provided in the second buffer chamber 58, and then, may be supplied as a pulse to the first process chamber 20 for a certain time. The reactor may include N₂. Only a radical component of a nitrogen reactor having a plasma state may be supplied as a pulse into the first process chamber 20 for a certain time. An oxygen radical having high reactivity may react with the adsorbed precursor, and thus, metal oxide may be conformally formed on an upper surface of the gate dielectric layer 220 to have an atomic layer thickness. Subsequently, a second purge operation may be performed by supplying a purge gas into the first process chamber 20. The nitrogen reactor and reaction by-products, which do not react in the second purge operation, may be discharged through the exhaust unit 70. As described above, only a method of forming the lower gate line 230 by using an ALD process has been described, but the inventive concepts are not limited thereto and the gate dielectric layer 220, the first blocking layer 240, the upper gate line 250, and the second blocking layer 260 may be formed by a combination of various precursors and reactors.

Hereinabove, example embodiments have been described in the drawings and the specification. Example embodiments have been described by using the terms described herein, but this has been merely used for describing the inventive concepts and has not been used for limiting a meaning or limiting the scope of the inventive concepts defined in the following claims. Therefore, it may be understood by those of ordinary skill in the art that various modifications and other equivalent example embodiments may be implemented from the inventive concepts. Accordingly, the spirit and scope of the inventive concepts may be defined based on the spirit and scope of the following claims.

While the inventive concepts have been particularly shown and described with reference to example embodiments thereof, it will be understood that various changes in form and details may be made therein without departing from the spirit and scope of the following claims.

What is claimed is:

1. A method of depositing an atomic layer, the method comprising:
   a plurality of deposition cycles,
   wherein each of the plurality of deposition cycles comprises
       rotating a valve plate included in an exhaust port by a first angle while supplying a precursor to a chamber into which a substrate is loaded,
       rotating the valve plate by a second angle while supplying a purge gas to the chamber,
       rotating the valve plate by a third angle while supplying a reactor to the chamber, and
       rotating the valve plate by the second angle while supplying the purge gas to the chamber, and
   wherein the first angle, the second angle, and the third angle are angles between an upper surface of the valve plate and a virtual plane vertical to an internal path of the exhaust port, and the first angle differs from the third angle.

2. The method of claim 1, wherein a time for which the precursor is supplied is within a range of 0.01 sec to 5 sec.

3. The method of claim 1, wherein, in the rotating of the valve plate by the first angle, pressure of the chamber is within a range of 0.1 Torr to 30 Torr.

4. The method of claim 1, wherein the precursor and the reactor are supplied in a pulse form.

5. The method of claim 1, wherein the second angle is greater than the first angle.

6. The method of claim 1, wherein the third angle is less than the second angle and greater than the first angle.

7. The method of claim 1, wherein the purge gas includes at least one of a hydrogen (H₂) gas and a nitrogen (N₂) gas.

8. The method of claim 1, wherein a time for which the purge gas is supplied to the chamber is longer than at least one of a time for which the precursor is supplied to the chamber and a time for which the reactor is supplied to the chamber.

9. The method of claim 1, wherein the precursor includes at least one of TiCl₄, Ti(NEt₂)₄, Ti(NEtMe)₄, WF₆, WCl₆MoCl₂H₂, MoCl₅, and Mo(CO)₆.

10. The method of claim 1, wherein the reactor includes at least one of NH₃, SiH₄, B₂H₆, and H₂.

11. A method of depositing an atomic layer, the method comprising:
    a plurality of deposition cycles,
    wherein each of the plurality of deposition cycles comprises rotating a valve plate included in an exhaust port by a first angle while adsorbing a precursor onto a chamber into which a substrate is loaded, rotating the valve plate by a second angle while purging and removing a portion of the precursor which is not adsorbed onto the substrate, based on a purge gas, rotating the valve plate by a third angle while adsorbing a reactor onto a surface of the substrate in the chamber, and rotating the valve plate by a fourth angle while purging and removing a portion of the reactor which is not adsorbed onto the substrate, based on the purge gas, wherein the first angle, the second angle, the third angle, and the fourth angle are angles between an upper surface of the valve plate and a virtual plane vertical to an internal path of the exhaust port, and wherein the third angle differs from the first angle and the fourth angle differs from the second angle.

12. The method of claim 11, wherein in the rotating of the valve plate by the first angle a pressure of the chamber is a first pressure within a range of 0.1 Torr to 30 Torr.

13. The method of claim 12, wherein in the rotating of the valve plate by the second angle the pressure of the chamber is a second pressure which is lower than the first pressure.

14. The method of claim 13, wherein in the rotating of the valve plate by the third angle the pressure of the chamber is a third pressure within a range of 0.1 Torr to 30 Torr.

15. The method of claim 14, wherein in the rotating of the valve plate by the fourth angle the pressure of the chamber is a fourth pressure which is lower than the third pressure.

16. The method of claim 11, wherein the precursor and the reactor are supplied in a pulse form.

17. The method of claim 11, wherein the precursor includes at least one of $TiCl_4$, $Ti(NEt_2)_4$, $Ti(NEtMe)_4$, $WF_6$, $WCl_6$, $MoCl_2H_2$, $MoCl_5$, and $Mo(CO)_6$.

18. The method of claim 11, wherein the third angle is less than the second angle and greater than the first angle, and the fourth angle is greater than each of the first angle, the second angle, and the third angle.

19. A method of depositing an atomic layer, the method comprising:

a plurality of deposition cycles, wherein each of the plurality of deposition cycles comprises rotating a valve plate included in an exhaust port by a first angle while supplying a precursor to a chamber, into which a substrate is loaded, in a pulse form for 0.01 sec to 5 sec, rotating the valve plate by a second angle while supplying a first purge gas including at least one of a hydrogen gas and a nitrogen gas to the chamber, rotating the valve plate by a third angle while supplying a reactor to the chamber in the pulse form for 0.01 sec to 5 sec, and rotating the valve plate by a fourth angle while supplying a second purge gas including at least one of the hydrogen gas and the nitrogen gas to the chamber, in the rotating of the valve plate by the first angle, pressure of the chamber is within a range of 0.1 Torr to 30 Torr, the precursor includes at least one of $TiCl_4$, $Ti(NEt_2)_4$, $Ti(NEtMe)_4$, $WF_6$, $WCl_6$ $MoCl_2H_2$, $MoCl_5$, and $Mo(CO)_6$, the first angle, the second angle, the third angle, and the fourth angle are angles between an upper surface of the valve plate and a virtual plane vertical to an internal path of the exhaust port, a time for which the first purge gas is supplied to the chamber is longer than a time for which the precursor is supplied to the chamber, and the first angle differs from the second angle and the third angle, and the second angle is greater than the first angle.

20. The method of claim 19, wherein, in the rotating of the valve plate by the first angle, a pressure of the chamber is a first pressure within a range of 0.1 Torr to 30 Torr, in the rotating of the valve plate by the second angle, the pressure of the chamber is a second pressure which is lower than the first pressure, in the rotating of the valve plate by the third angle, the pressure of the chamber is a third pressure within the range of 0.1 Torr to 30 Torr, and in the rotating of the valve plate by the fourth angle, the pressure of the chamber is a fourth pressure which is lower than the third pressure.

* * * * *